United States Patent
Talty et al.

(10) Patent No.: US 9,722,647 B2
(45) Date of Patent: Aug. 1, 2017

(54) CALIBRATION TECHNIQUES FOR SIGMA DELTA TRANSCEIVERS

(71) Applicant: GM GLOBAL TECHNOLOGY OPERATIONS LLC, Detroit, MI (US)

(72) Inventors: Timothy J. Talty, Beverly Hills, MI (US); Mohiuddin Ahmed, Moorpark, CA (US); Cynthia D. Baringer, Piedmont, CA (US); Yen-Cheng Kuan, Los Angeles, CA (US); James Chingwei Li, Simi Valley, CA (US); Hsuanyu Pan, Los Angeles, CA (US); Emilio A. Sovero, Thousand Oaks, CA (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

(21) Appl. No.: 15/433,991

(22) Filed: Feb. 15, 2017

(65) Prior Publication Data

US 2017/0163295 A1    Jun. 8, 2017

Related U.S. Application Data

(63) Continuation-in-part of application No. 15/103,256, filed as application No. PCT/US2015/059583 on Nov. 6, 2015, now Pat. No. 9,608,661.

(60) Provisional application No. 62/076,324, filed on Nov. 6, 2014.

(51) Int. Cl.
*H04B 1/04*    (2006.01)
*H04B 1/40*    (2015.01)

(52) U.S. Cl.
CPC .............. *H04B 1/0475* (2013.01); *H04B 1/40* (2013.01); *H04B 2001/0425* (2013.01)

(58) Field of Classification Search
CPC . H04B 1/0475; H04B 1/40; H04B 2001/0425
USPC ...................................... 455/114.3
See application file for complete search history.

(56) References Cited

U.S. PATENT DOCUMENTS

| | | |
|---|---|---|
| 6,611,221 B1 | 8/2003 | Soundarapandian et al. |
| 6,697,003 B1 | 2/2004 | Chen |
| 7,183,955 B1 | 2/2007 | Shih |
| 7,298,308 B1 | 11/2007 | Rueger et al. |
| 8,154,432 B2 | 4/2012 | Kaper et al. |
| 2006/0057983 A1 | 3/2006 | Thompson et al. |

(Continued)

*Primary Examiner* — April G Gonzales
(74) *Attorney, Agent, or Firm* — John A. Miller; Miller IP Group, PLC

(57) ABSTRACT

A cellular radio architecture that includes a transceiver front-end circuit including an antenna and a switch module having a switching network that directs analog transmit signals to be transmitted to the antenna and receives receive signals from the antenna. The architecture further includes a receiver module having a separate signal channel for each of the signal paths in the multiplexer module, where each signal channel in the receiver module includes a receiver delta-sigma modulator that converts analog receive signals to a representative digital signal. The architecture also includes a transmitter module having a transmitter delta-sigma modulator for converting digital data bits to the transmit signals. The transmitter module includes a tunable bandpass filter and a power amplifier for amplifying the transmit signals before transmitting. The architecture also includes a calibration feedback and switch module that receives the amplified signals from the power amplifier.

19 Claims, 17 Drawing Sheets

(56) References Cited

U.S. PATENT DOCUMENTS

| | | |
|---|---|---|
| 2006/0109153 A1 | 5/2006 | Gupta |
| 2006/0245517 A1 | 11/2006 | Ikedo et al. |
| 2008/0212653 A1 | 9/2008 | Kurashima et al. |
| 2009/0088124 A1 | 4/2009 | Schuur et al. |
| 2010/0166124 A1 | 7/2010 | Behrens et al. |
| 2011/0163909 A1 | 7/2011 | Jeong |
| 2013/0194114 A1 | 8/2013 | Ritter et al. |
| 2013/0344819 A1 | 12/2013 | Ozgur et al. |

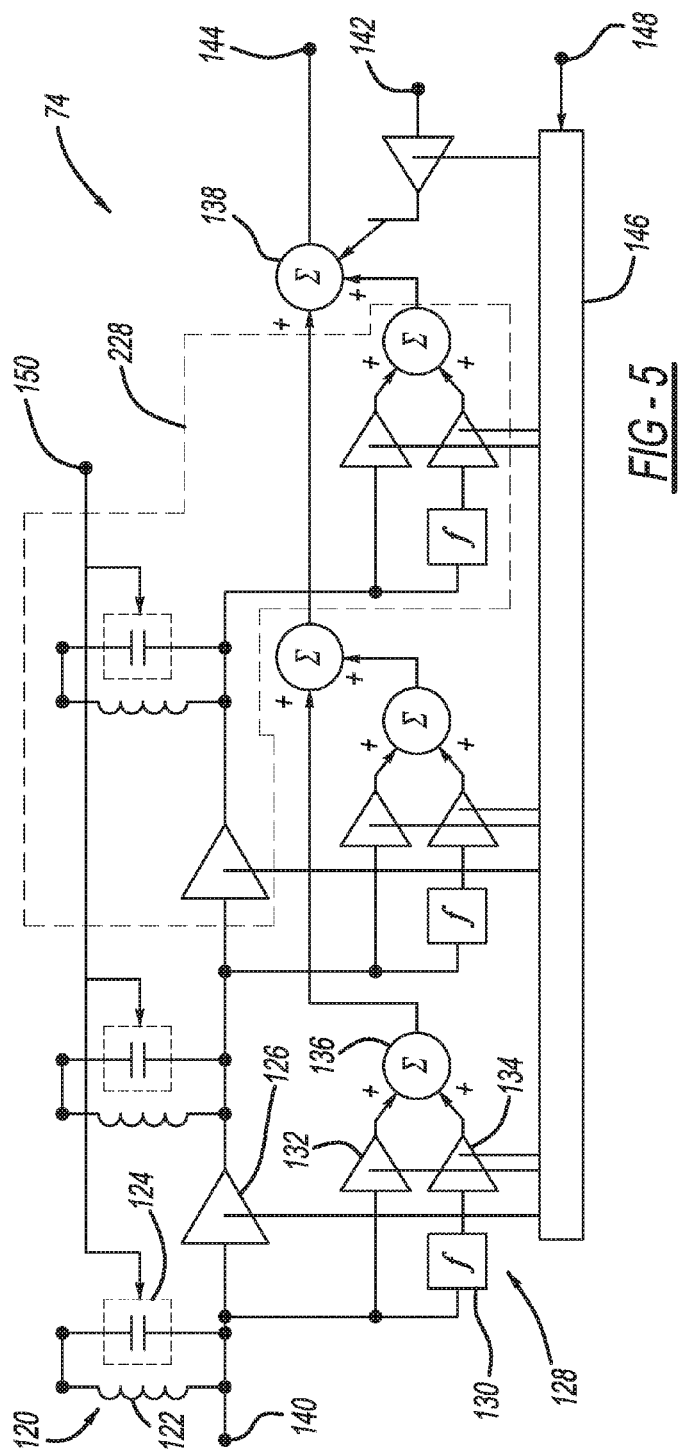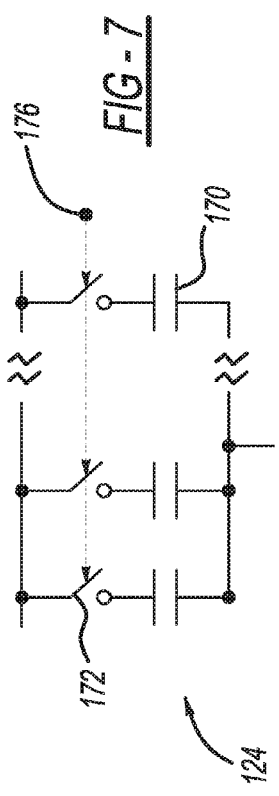

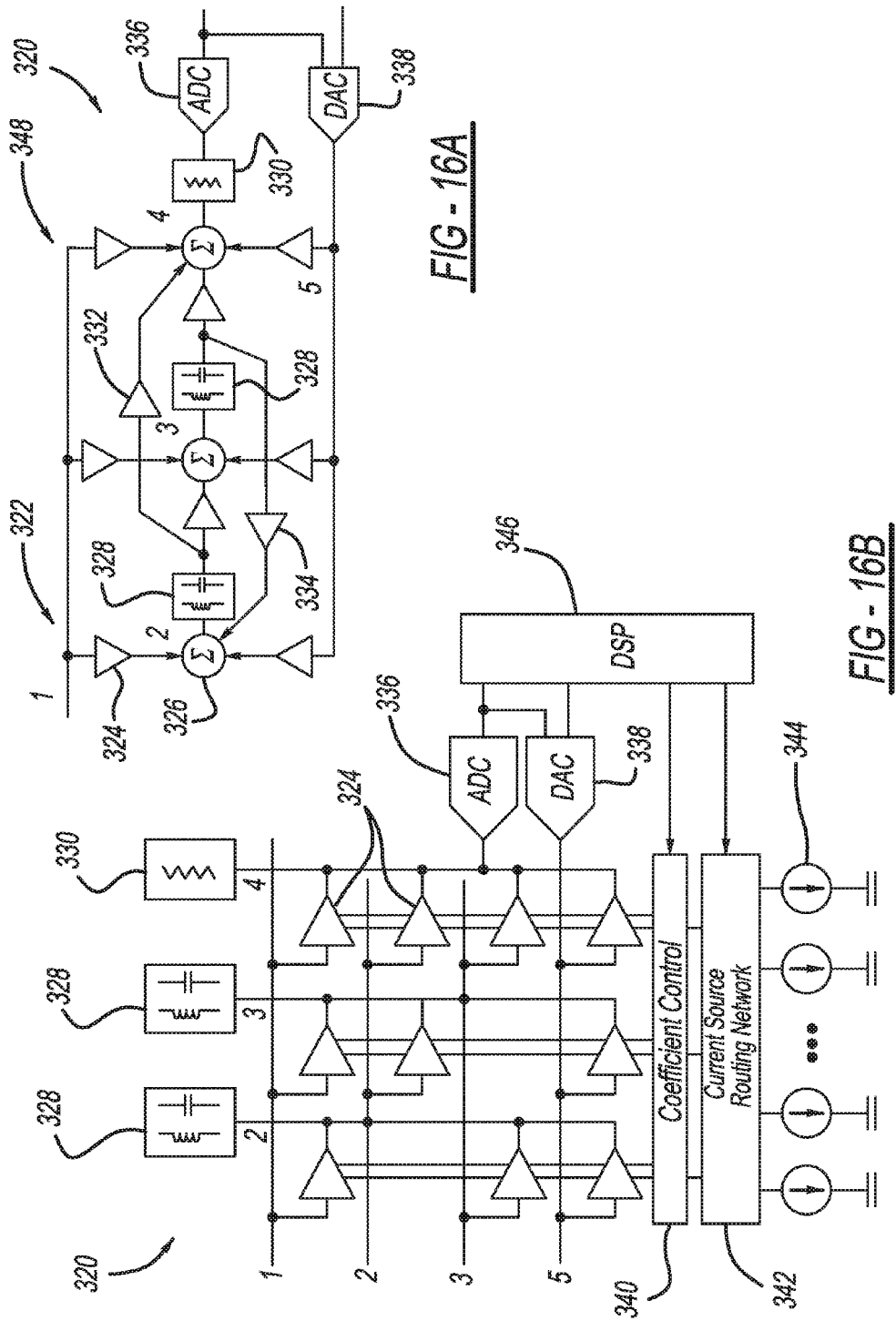

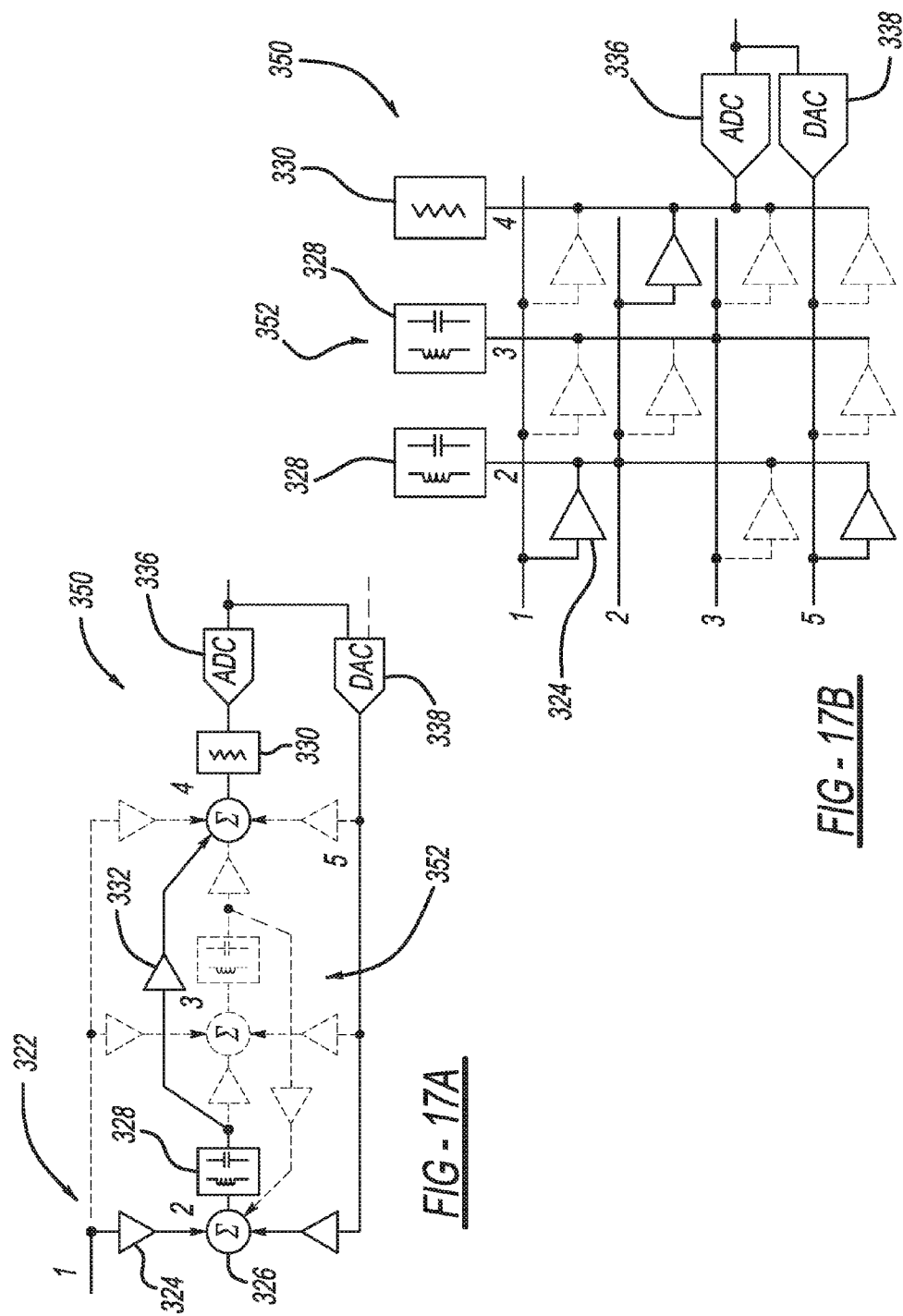

CALIBRATION TECHNIQUES FOR SIGMA DELTA TRANSCEIVERS

CROSS-REFERENCE TO RELATED APPLICATIONS

This application is a Continuation-in-Part application of U.S. patent application Ser. No. 15/103,256, entitled, "Software Programmable Cellular Radio Architecture for Wide Bandwidth Radio Systems including Telematics and Infotainment Systems," filed Jun. 9, 2016, which is a national stage application of International Application No. PCT/US2015/059583, entitled, "Software Programmable Cellular Radio Architecture for Wide Bandwidth Radio Systems including Telematics and Infotainment Systems," filed Nov. 6, 2015, which claims the benefit of the priority date of U.S. Provisional Patent Application Ser. No. 62/076,324, entitled, "Software Programmable Cellular Radio Architecture for Wide Bandwidth Radio Systems including Telematics and Infotainment Systems," filed Nov. 6, 2014.

BACKGROUND OF THE INVENTION

Field of the Invention

This invention relates generally to wide bandwidth radio systems designed to adapt to various global radio standards and, more particularly, to a cellular radio architecture that includes a calibration feedback and switch module that receives amplified signals from a power amplifier, and includes a switch that selectively directs the amplified transmit signals to the antenna or a calibration circuit that determines pre-distortion values in the transmit signals that are fed back as a calibration feedback signal to compensate for distortions in the power amplifier.

Discussion of the Related Art

Traditional cellular telephones employ different modes and bands of operation that have been supported in hardware by having multiple disparate radio front-end and baseband processing chips integrated into one platform, such as tri-band or quad-band user handsets supporting global system for mobile communications (GSM), general packet radio service (GPRS), etc. Known cellular receivers have integrated some of the antenna and baseband data paths, but nevertheless the current state of the art for mass mobile and vehicular radio deployment remains a multiple static channelizing approach. Such a static architecture is critically dependent on narrow-band filters, duplexers and standard-specific down-conversion to intermediate-frequency (IF) stages. The main disadvantage of this static, channelized approach is its inflexibility with regards to the changing standards and modes of operation. As the cellular communications industry has evolved from 2G, 3G, 4G and beyond, each new waveform and mode has required a redesign of the RF front-end of the receiver as well as expanding the baseband chip set capability, thus necessitating a new handset. For automotive applications, this inflexibility to support emerging uses is prohibitively expensive and a nuisance to the end-user.

Providing reliable automotive wireless access is challenging from an automobile manufacturers point of view because cellular connectivity methods and architectures vary across the globe. Further, the standards and technologies are ever changing and typically have an evolution cycle that is several times faster than the average service life of a vehicle. More particularly, current RF front-end architectures for vehicle radios are designed for specific RF frequency bands. Dedicated hardware tuned at the proper frequency needs to be installed on the radio platform for the particular frequency band that the radio is intended to operate at. Thus, if cellular providers change their particular frequency band, the particular vehicle that the previous band was tuned for, which may have a life of 15 to 20 years, may not operate efficiently at the new band. Hence, this requires automobile manufactures to maintain a myriad of radio platforms, components and suppliers to support each deployed standard, and to provide a path to upgradability as the cellular landscape changes, which is an expensive and complex proposition.

Known software-defined radio architectures have typically focused on seamless baseband operations to support multiple waveforms and have assumed similar down-conversion-to-baseband specifications. Similarly, for the transmitter side, parallel power amplifier chains for different frequency bands have typically been used for supporting different waveform standards. Thus, receiver front-end architectures have typically been straight forward direct sampling or one-stage mixing methods with modest performance specifications. In particular, no prior application has required a greater than 110 dB dynamic range with associated IP3 factor and power handling requirements precisely because such performance needs have not been realizable with complementary metal oxide semiconductor (CMOS) analog technology. It has not been obvious how to achieve these metrics using existing architectures for CMOS devices, thus the dynamic range, sensitivity and multi-mode interleaving for both the multi-bit analog-to-digital converter (ADC) and the digital-to-analog converter (DAC) is a substantially more difficult problem.

Software-defined radio architectures do not currently exist in the automotive domain, but have been proposed and pursued in other non-automotive applications, such as military radios with multi-band waveforms. However, in those areas, because of vastly different waveform needs, conflicting operational security needs and complex interoperability requirements, a zero-IF approach has proven technically difficult. Known software defined radios have typically focused on backend processing, specifically providing seamless baseband operations to support multiple waveforms. The modest performance specifications haven't demanded anything more aggressive from front-end architectures. Straight-forward direct sampling or 1-stage mixing methods have been sufficient in the receiver. For software defined radios that employ delta-sigma modulators, the component function is commonly found after a down conversion stage and has low-pass characteristics. With regard to the transmitter, parallel multiple power amplifier chains to support differing frequency bands and waveform standards have been sufficient for meeting the requirements.

As radio systems evolve toward compact multi-function operation, the dynamic range of the receiver is heavily challenged by having to detect a very weak desired signal in the presence of the radios large transmit signal. Less than ideal antenna reflection and imperfect transmit-to-receive isolation may present a fairly large transmit signal at a frequency near the smaller desired receive signal frequency. The impact of this imperfect isolation and antenna reflection has traditionally been resolved through the use of static surface acoustic wave (SAW) or bulk acoustic wave (BAW) filters. However, these types of filters are generally employed for fixed frequencies and do not support a reconfigurable radio architecture.

To obtain the benefits of a full duplex mode operation, i.e., receiving and transmitting at the same time, it is necessary to eliminate or greatly reduce the level of self-interference cause by the transmit signal. In the recent literature, several cancellation schemes have been identified almost all of which have been narrow band approaches given the nature of the transmit/receive amplifiers, and most have been directed towards interference from external sources as opposed to self-interference cancellation. The techniques for external interference cancellation necessarily have to rely on unknown signal estimation methods, and thus cannot achieve the same dynamic range that is required for wideband sigma-delta modulations applications.

Other related approaches for transmit signal cancellation require multiple antennas to effectively move the duplexing problem from the frequency and/or time domain to the spatial domain, which relies on the placement of the antennas to null the interfering signal. With the desire for smaller transceiver designs and multiple-input multiple-output (MIMO) integration requiring its own antenna resources, having multiple antenna dedicated to the function of self interference cancellation is unattractive.

A handful of RF cancellation schemes requiring only a single antenna have been identified in the art. In these approaches, a sample or replica of the transmitted signal is modified and combined with other signals entering the receiver to cancel the self-interfering signal. The proposed solutions have been for narrow band application and either suffer insertion loss or require extra hardware and are expensive.

Delta-sigma modulators are becoming more prevalent in digital receivers because, in addition to providing wideband high dynamic range operation, the modulators have many tunable parameters making them a good candidate for reconfigurable systems. Interesting possibilities occur for transmit signal cancellation when a bandpass delta-sigma modulator is used as the front end of an ADC. Wider-dynamic range operation can be achieved by moving the low noise amplifier (LNA) in the receiver front-end after the primary feedback summation node in the modulator so that the signal into the LNA is the error or difference between the input and the estimated or quantized version of the input signal. Derived from the quantization error, it can be found that the input power is reduced by the number of DAC bits. Accordingly, the required input intercept point decreases by the same amount for a fixed dynamic range.

Since the performance requirements on a feedback DAC are the same as the overall modulator, the larger the number of bits in the DAC, the harder it is to meet the dynamic range. For those applications where it is not feasible to have a high bit resolution DAC an alternate technique for cancellation is needed. For example, it is possible to leverage the modified modulator architecture to augment RF cancellation by replicating the transmit signal, and then subtracting it along with the quantized estimation signal. The transmitter directly synthesizes the RF signal in the digital domain so that the digital data is readily available. The transmit data sequence is then converted to an analog signal with an N-bit replica DAC. The feedback DAC, the transmit DAC, and the replica DAC have a particular multi-bit resolution. Although there are no constraints on the multi-bit resolution, having the bit resolution of the replica DAC be equal to or less than the transmit DAC is the most efficient implementation and offers the highest potential for circuit and design reuse. The digital data will be modified by the adaptive processing function so that the replicated transmit signal, particularly the phase and strength, is a better approximation to the unwanted signal arriving at the receiver input.

SUMMARY OF THE INVENTION

The present disclosure describes a cellular radio architecture The architecture includes a transceiver front-end circuit including an antenna and a switch module having a switching network that directs analog transmit signals to be transmitted to the antenna and receives receive signals from the antenna. The switch module further includes a multiplexer module coupled to the switching network that includes a plurality of signal paths, where each signal path includes a bandpass filter that passes a different frequency band than the other bandpass filters and a circulator that provides signal isolation between the transmit signals and the receive signals. The architecture further includes a receiver module having a separate signal channel for each of the signal paths in the multiplexer module, where each signal channel in the receiver module includes a receiver delta-sigma modulator that converts analog receive signals to a representative digital signal. The architecture also includes a transmitter module having a transmitter delta-sigma modulator for converting digital data bits to the transmit signals. The transmitter module includes a tunable bandpass filter and a power amplifier for amplifying the transmit signals before transmitting. The architecture also includes a calibration feedback and switch module that receives the amplified signals from the power amplifier, and that includes a switch that selectively directs the amplified transmit signals to the antenna or a calibration circuit that determines pre-distortion values in the transmit signals that are fed back as a calibration feedback signal to the transmitter module to compensate for distortions in the power amplifier. The architecture also includes a compensation module that provides timing, phase, frequency and bias setting signals to the receiver module and the transmitter module. The architecture further includes a self-interference cancellation module that subtracts residual transmits signals that leak into the receiver module.

Additional features of the present invention will become apparent from the following description and appended claims, taken in conjunction with the accompanying drawings.

BRIEF DESCRIPTION OF THE DRAWINGS

FIG. 5 is a schematic block diagram of the sixth-order filter employed in the delta-sigma modulator shown in FIG. 3;

FIG. 7 is a capacitor array providing course and fine tuning employed in one of the resonators in the sixth-order filter shown in FIG. 5;

FIGS. 16A and 16B are schematic diagrams of a fourth order delta-sigma modulator including an array of gm cells;

FIGS. 17A and 17B are schematic diagrams of the fourth order delta-sigma modulator shown in FIGS. 16A and B reduced to a second order delta-sigma modulator;

DETAILED DESCRIPTION OF THE EMBODIMENTS

The following discussion of the embodiments of the invention directed to a cellular radio architecture is merely exemplary in nature, and is in no way intended to limit the invention or its applications or uses. For example, the radio architecture of the invention is described as having application for a vehicle. However, as will be appreciated by those skilled in the art, the radio architecture may have other applications other than automotive applications.

The technologies discussed herein are applicable to more than cellular wireless technologies, for example, WiFi (IEEE 802.11) technologies. Further, the cellular radio architecture is presented as a fully duplexed wireless system, i.e., one that both transmits and receives. For wireless services that are receive only, such as global positioning system (GPS), global navigation satellite system (GNSS) and various entertainment radios, such as AM/FM, digital audio broadcasting (DAB), SiriusXM, etc., only the receiver design discussed herein would be required. Also, the described radio architecture design will enable one radio hardware design to function globally, accommodating various global wireless standards through software updates. It will also enable longer useful lifespan of the radio hardware design by enabling the radio to adapt to new wireless standards when they are deployed in the market. For example, 4G radio technology developments and frequency assignments are very dynamic. Thus, radio hardware deployed in the market may become obsolete after just one or two years. For applications, such as in the automotive domain, the lifespan can exceed ten years. This invention enables a fixed hardware platform to be updateable through software updates, thus extending the useful lifespan and global reuse of the hardware.

Figure 1:
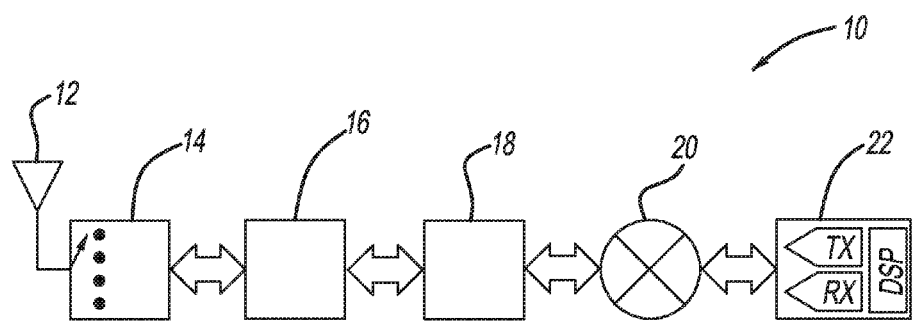
FIG. 1 is a block diagram of a known multi-mode, multi-band cellular communications handset architecture.

FIG. 1 is a block diagram of a known multi-mode, multi-band cellular communications user handset architecture 10 for a typical cellular telephone. The architecture 10 includes an antenna structure 12 that receives and transmits RF signals at the frequency band of interest. The architecture 10 also includes a switch 14 at the very front-end of the architecture 10 that selects which particular channel the transmitted or received signal is currently for and directs the signal through a dedicated set of filters and duplexers represented by box 16 for the particular channel. Modules 18 provide multi-mode and multi-band analog modulation and demodulation of the receive and transmit signals and separates the signals into in-phase and quadrature-phase signals sent to or received from a transceiver 20. The transceiver 20 also converts analog receive signals to digital signals and digital transmit signals to analog signals. A baseband digital signal processor 22 provides the digital processing for the transmit or receive signals for the particular application.

Figure 2:
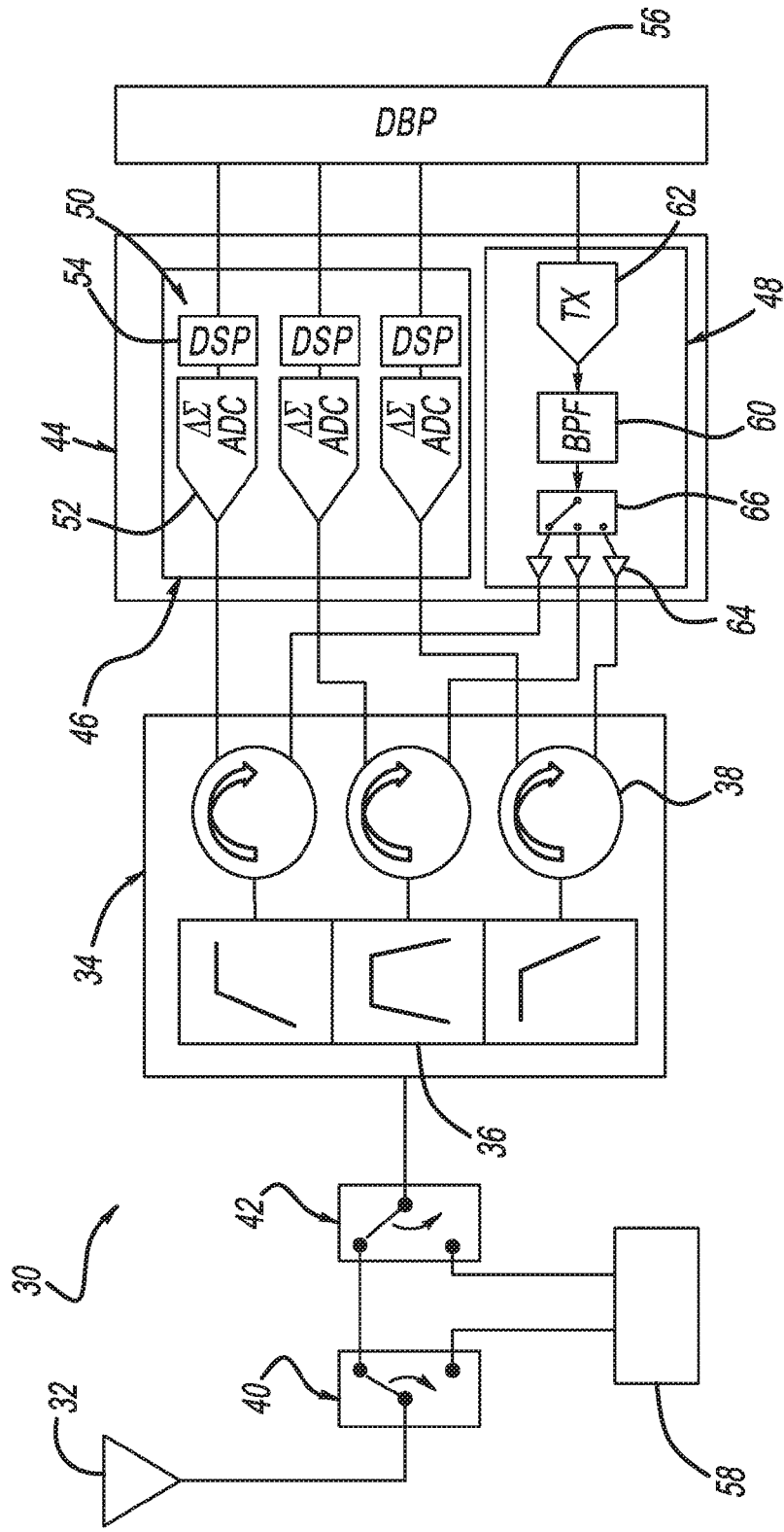
FIG. 2 is a block diagram of a software-programmable cellular radio architecture applicable.

FIG. 2 is a schematic block diagram of a cellular radio front-end architecture 30 that provides software programmable capabilities as will be discussed in detail below. The architecture 30 includes an antenna structure 32 capable of receiving and transmitting the cellular telephone frequency signals discussed herein, such as in a range of 400 MHz-3.6 GHz. Signals received and transmitted by the antenna structure 32 go through a triplexer 34 that includes three signal paths, where each path is designed for a particular frequency band as determined by a bandpass filter 36 in each path. In this embodiment, three signal paths have been selected, however, the architecture 30 could be expanded to a higher number of signal paths. Each signal path includes a circulator 38 that separates and directs the receive and transmit signals, and provides isolation so that the high power signals being transmitted do not enter the receiver side and saturate the receive signals at those frequency bands.

The architecture 30 also includes a front-end transceiver module 44 that is behind the triplexer 34 and includes a receiver module 46 that processes the receive signals and a transmitter module 48 that processes the transmit signals. The receiver module 46 includes three receiver channels 50, one for each of the signal paths through the triplexer 34, where a different one of the receiver channels 50 is connected to a different one of the circulators 38, as shown. Each of the receiver channels 50 includes a delta-sigma modulator 52 that receives the analog signal at the particular frequency band and generates a representative stream of digital data using an interleaving process in connection with a number of N-bit quantizer circuits operating at a very high clock rate, as will be discussed in detail below. As will further be discussed, the delta-sigma modulator 52 compares the difference between the receive signal and a feedback signal to generate an error signal that is representative of the digital data being received. The digital data bits are provided to a digital signal processor (DSP) 54 that extracts the digital data to provide the audio content in the receive signal. A digital baseband processor (DBP) 56 receives and operates on the digital data stream for further signal processing in a manner well understood by those skilled in the art. The transmitter module 48 receives digital data to be transmitted from the processor 56. The module 48 includes a transmitter circuit 62 having a delta-sigma modulator that converts the digital data to an analog signal. The analog signal is filtered by a tunable bandpass filter (BPF) 60 to remove out of band emissions and sent to a switch 66 that directs the signal to a selected power amplifier 64 optimized for the transmitted signal frequency band. The amplified signal is sent to the particular circulator 38 in the triplexer 34 depending on which frequency is being transmitted.

As will become apparent from the discussion below, the configuration of the architecture 30 provides software programmable capabilities through high performance delta-sigma modulators that provide optimized performance in the signal band of interest and that can be tuned across a broad range of carrier frequencies. The architecture 30 meets current cellular wireless access protocols across the 0.4-2.6 GHz frequency range by dividing the frequency range into three non-continuous bands. However, it is noted that other combinations of signal paths and bandwidth are of course possible. The triplexer 34 implements frequency domain de-multiplexing by passing the RF carrier received at the antenna structure 32 into one of the three signal paths. Conversely, the transmit signal is multiplexed through the triplexer 34 onto the antenna structure 32. For vehicular wireless access applications, such a low-cost integrated device is desirable to reduce parts cost, complexity, obsolescence and enable seamless deployment across the globe.

The delta-sigma modulators 52 are positioned near the antenna structure 32 so as to directly convert the RF receive signals to bits in the receiver module 46 and bits to an RF signal in the transmitter module 48. The main benefit of using the delta-sigma modulators 52 in the receiver channels 50 is to allow a variable signal capture bandwidth. This is possible because the architecture 30 enables software manipulation of the modulator filter coefficients to vary the signal bandwidth and tune the filter characteristics across the RF band, as will be discussed below.

The architecture 30 allows the ability to vary signal capture bandwidth, which can be exploited to enable the reception of continuous carrier aggregated waveforms without the need for additional hardware. Carrier aggregation is a technique by which the data bandwidths associated with multiple carriers for normally independent channels are combined for a single user to provide much greater data rates than a single carrier. Together with MIMO, this feature is a requirement in modern 4G standards and is enabled by the orthogonal frequency division multiplexing (OFDM) family of waveforms that allow efficient spectral usage.

The architecture 30 through the delta-sigma modulators 52 can handle the situation for precise carrier aggregation scenarios and band combinations through software tuning of the bandpass bandwidth, and thus enables a multi-segment capture capability. Dynamic range decreases for wider bandwidths where more noise is admitted into the sampling bandpass. However, it is assumed that the carrier aggregation typically makes sense when the user has a good signal-to-noise ratio, and not cell boundary edges when connectivity itself may be marginal. Note that the inter-band carrier aggregation is automatically handled by the architecture 30 since the triplexer 34 feeds three independent modulators in the channels 50.

The circulators 38 route the transmit signals from the transmitter module 48 to the antenna structure 32 and also provide isolation between the high power transmit signals and the receiver module 46. Although the circulators 38 provide significant signal isolation, there is some port-to-port leakage within the circulator 38 that provides a signal path between the transmitter module 48 and the receiver module 46. A second undesired signal path occurs due to reflections from the antenna structure 32, and possible other components in the transceiver. As a result, a portion of the transmit signal will be reflected from the antenna structure 32 due to a mismatch between the transmission line impedance and the antenna's input impedance. This reflected energy follows the same signal path as the incoming desired signal back to the receiver module 46.

As will be discussed in detail below, the present invention proposes an interference cancellation scheme that rejects the self-generated interference leaking into the receiver path from the transmitter module 48, and is incorporated into the delta-sigma modulator architecture to support full-duplex wireless transmission in the software programmable receiver. The proposed transceiver architecture employs an adaptive cancellation scheme to attenuate the interfering transmit signal into the ADC implemented by the delta-sigma modulator 52. The reduction in transmitted power need only be sufficient for linear processing by the delta-sigma modulator 52 so that the additional digital cancellation of the signal may be performed in the post-processing circuitry, i.e., the DSP 54 and the DBP 56.

The proposed technique for self-interference cancellation leverages the unique properties of delta-sigma modulator architectures to add functionality in a hardware efficient manner. The transmit signal leakage information is already known prior to the actual cancellation point in the receiver module 46. Accordingly, as part of the transceiver initialization, the receiver channel 50 can be characterized and since the digital information signal is known, all of the interference correction can be pre-distorted in the digital domain. This is different than in most of the known interference cancellation schemes. Also, in the embodiments where the receiver modulator architecture with the feedback signal precedes the low noise amplifier, the transceiver already employs a directional coupler so it is not necessary to add any additional hardware in the receiver path. As will be described, in one approach the cancellation technique generates a cancellation vector that is a modified version of the transmit signal to cancel the self-interference signal from entering the receiver module 46. The creation of the cancellation vector is unique in that the bandpass delta-sigma modulator 52 for the ADC is used in the receiver channel 50.

The architecture 30 is also flexible to accommodate other wireless communications protocols. For example, a pair of switches 40 and 42 can be provided that are controlled by the DSP 56 to direct the receive and transmit signals through dedicated fixed RF devices 58, such as a global system for mobile communications (GSM) RF front end module or a WiFi finite element method (FEM). In this embodiment, some select signal paths are implemented via conventional RF devices. FIG. 2 only shows one additional signal path, however, this concept can be expanded to any number of additional signal paths depending on use cases and services.

Figure 3:
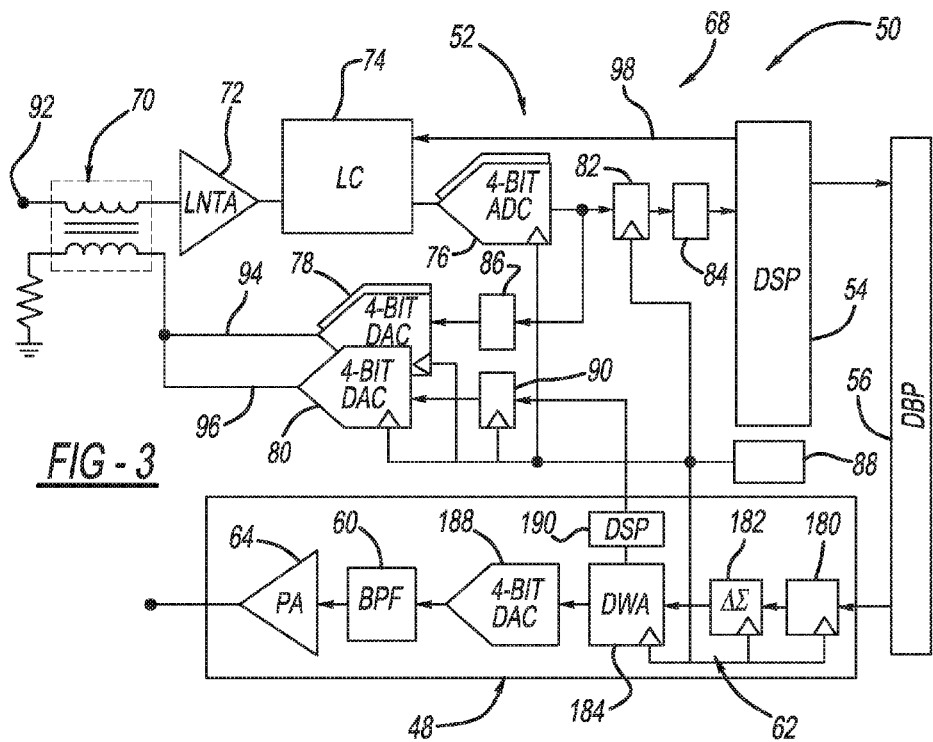
FIG. 3 is a block diagram of a transceiver for the radio architecture shown in FIG. 2 including one of the receiver channels having a delta-sigma modulator showing interleaved quantizers and a transmitter module.

FIG. 3 is a schematic block diagram of an architecture 68 that is a portion of the architecture 30 including one of the receiver channels 50 having the delta-sigma modulator 52 and the DSP 54, the transmitter module 48 and the baseband processor 56. The receive signals from the circulator 38 at node 92 are provided to a broadband combiner 70 operating as a summation junction. A receive feedback signal on a feedback line 94 and a transmit cancellation signal on line 96 are also provided to the combiner 70 and are subtracted from the receive signal to generate an analog error signal that is sent to a low noise transconductance amplifier (LNTA) 72. The desired signal component of the receive signal is unaffected by the signal cancellation circuitry, but the unwanted transmit signal energy is reduced by the transmit cancellation signal. The amplified error signal is provided to a sixth-order LC filter 74, where the filter 74 operates as a bandpass filter to reshape the noise in the analog error signal so that it is out of the desired signal band, thus obtaining quality signal-to-noise and distortion performance.

In low-pass or low-IF bandwidth modular designs having a faster clock rate means a higher oversampling ratio (OSR), i.e., the ratio of the clock speed to twice the signal bandwidth, which means better dynamic range. In a high-RF bandpass design, the clock rate is constrained by the clock-to-carrier ratio. For a sampling rate to RF carrier frequency ratio less than four, the digital filter becomes substantially more complicated. To meet cellular standards in the high receive band up to 2.6 GHz, a clock rate of 10.4 GHz would be required. However, for these clock rates, achieving 100 dB of dynamic range in the analog feedback signal to the combiner 70 is unrealistic. To address this challenge, the present invention provides interleaved quantizer circuits to reduce the clock rate to 5.2 GHz. The quantizer circuits are clocked at half rate, but the achieved clock rate is still 10.4 GHz, which has the advantage of maintaining an OSR greater than 512 for a 20 MHz signal band, but making stability more challenging since the feedback delay is relative to the effective clock period it is easier to exceed a threshold for stability.

Based on this discussion, the filtered error signal from the filter 74 is provided to a series of multi-bit ADCs 76, here 4-bits although other multi-bit ADCs can be employed, such as two or three bit ADCs. The ADCs 76 convert the error signal to a digital signal in a serial interleaving manner at the output of the ADC 76. Interleaving as used herein means that the analog carrier frequency from the filter 74 is processed in separate sections by the plurality of the ADCs 76 so that the rate at which the conversion process is being performed can be reduced. Those bits are sent to a series of 4-bit DACs 78, although other multi-bit ADCs can be employed, such as two or three, in the feedback line 94, where the combination of each pair of the ADC 76 and the DAC 78 is a quantizer circuit that operates as a 4-bit interleaver on multiple groups of 4-bits, as will be discussed in further detail below. An upper bound on the number of bits is set by the ability to design the DAC 78 to meet the dynamic range of the system. Unlike the 4-bit ADC 76 that is in the forward path of the modulator 52, the non-linearities of the DAC 78 are not shaped by the filter 74 and directly affect the performance. The interleaving process provides the groups of 4-bits from the ADCs 76 through a data weighted averaging (DWA) digital shaper circuit 86 before being provided to the DACs 78. Because interleaving allows the sampling rate to be reduced oversampling to maintain bit integrity is not required. Thus the bit resolution is four in this embodiment, but each pair of the ADCs 76 and the DACs 78 in the quantizer circuit need only operate at half-speed making it easier to meet dynamic range requirements.

Interleaving both the multi-bit ADCs 76 and DACs 78 as proposed herein is a substantially harder problem than addressed in the prior art. Meeting dynamic range goals requires matching among the interleaved ADCs 76 and the DACs 78 in addition to managing mismatch within an individual DAC. Also, interleaving increases the excess phase delay in the loop and requires compensation to maintain stability. The clock rates in delta-sigma ADC designs used herein are typically as fast as possible without degrading the modulator performance by introducing jitter into the system. It is noted that the order of the delta-sigma modulators is design specific for a particular implementation.

Figure 4:
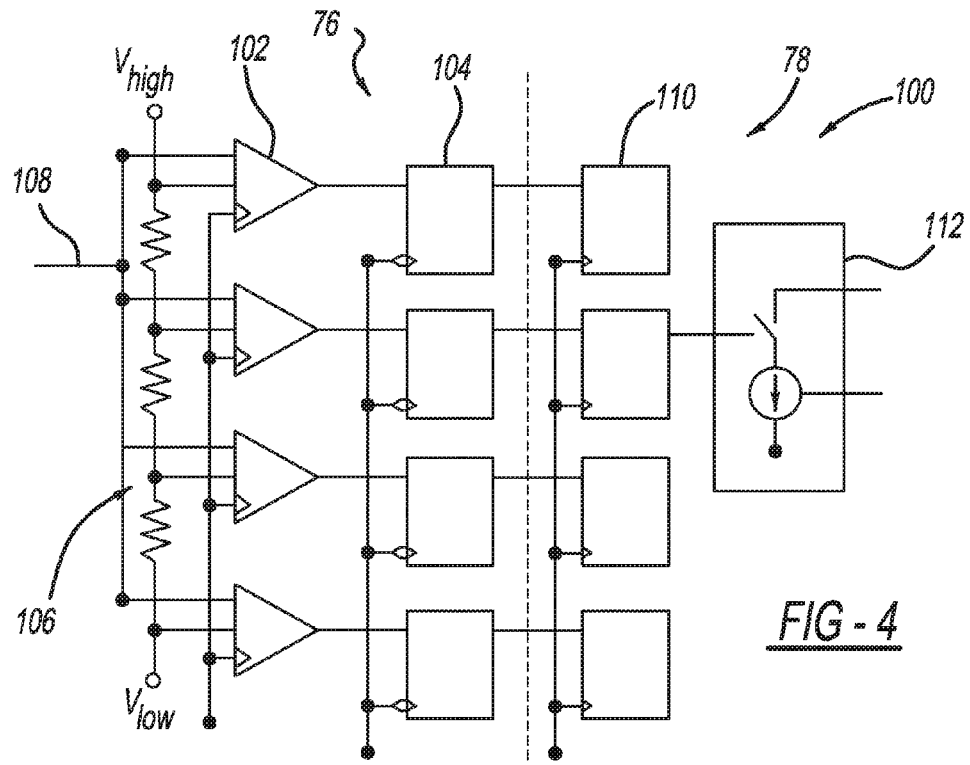
FIG. 4 is a schematic diagram of a multi-bit quantizer employed in the delta-sigma modulator shown in FIG. 3.

FIG. 4 is a schematic diagram of a quantizer circuit 100 defined by one group of the ADCs 76 and the DACs 78. The ADC 76 and the DAC 78 include a bit path for each bit in the multi-bit quantizer. Each signal path in the ADC 76 includes a comparator 102 and a latch 104. A voltage divider network 106 sets a different reference voltage for each of the comparators 102 in each of the signal paths. The analog signal from the filter 74 is provided on line 108 and is sent to each of the comparators 102. If that voltage level is above the reference level for the particular comparator 102, then the latch 104 for that channel is set high for that bit. The DAC 78 includes latches 110 that reset the bits back to an analog signal through a switch 112.

Delta-sigma modulators are a well known class of devices for implementing analog-to-digital conversion. The fundamental properties that are exploited are oversampling and error feedback (delta) that is accumulated (sigma) to convert the desired signal into a pulse modulated stream that can subsequently be filtered to read off the digital values, while effectively reducing the noise via shaping. The key limitation of known delta-sigma modulators is the quantization noise in the pulse conversion process. Delta-sigma converters require large oversampling ratios in order to produce a sufficient number of bit-stream pulses for a given input. In direct-conversion schemes, the sampling ratio is greater than four times the RF carrier frequency to simplify digital filtering. Thus, required multi-GHz sampling rates have limited the use of delta-sigma modulators in higher frequency applications. Another way to reduce noise has been to use higher order delta-sigma modulators. However, while first order canonical delta-sigma architectures are stable, higher orders can be unstable, especially given the tolerances at higher frequencies. For these reasons, state of the art higher order delta-sigma modulators have been limited to audio frequency ranges, i.e., time interleaved delta-sigma modulators, for use in audio applications or specialized interleaving at high frequencies. The present invention improves upon prior approaches through the sixth-order filter 74 with the feedback structure for maximum flexibility in the noise shaping characteristics. The modulators 52 can achieve a dynamic range of 100 dB over a signal bandwidth of 20 MHz across an RF bandwidth of 400 MHz.

A decoder 82 receives the multi-bit sequence from all of the ADCs 76 simultaneously and reconfigures the bits in the proper orientation to be output as a serial data stream. The bits are then provided to a de-multiplexer 84 to provide the data stream at the lower clock rate. Particularly, the output data bits from the ADCs 76 are decoded from thermometer code to binary code and de-multiplexed down to a data rate that can be supported by the DSP 54. Operational parameters for the filter 74 are set by the DSP 54 and are provided on line 98. Also, a calibration phase is performed to optimize the performance for the receive channel 50. A clocking device 88 provides the clock signals to the various components in the architecture 68, as shown, where the frequency of the clock rate determines power consumption and semiconductor material as will be discussed in further detail below.

FIG. 5 is a schematic diagram of the sixth-order filter 74 that includes three passive LC resonator circuits 120 each including an inductor 122 and a capacitor array 114. As is well understood by those skilled in the art, the number of orders of a particular filter identifies the number of poles, where the number of poles defines the number of LC circuits. Filtering and correction algorithms are applied to the digital output stream in the DSP 54. Low-speed tuning and calibration signals are fed back into the filter 74 on the line 98 for reconfiguring and optimizing the filter 74. The filter 74 also includes a series of transconductance amplifiers 126 in the primary signal path. A feed-forward path provides stability and includes integrator circuits 128 each including an integrator 130, two tunable transconductance amplifiers 132 and 134 and a summer 136. The filter 74 has a feed-forward architecture where signals are fed from early resonator stages into a final summing junction 138. The signal from the LTNA 72 is provided at node 140, and the most significant bit of the 4-bit DAC 78 in the feedback loop on the line 94 is provided at node 142. The output of the filter 74 is provided to the ADCs 76 at node 144. A low-speed DAC array 146 receives coefficient control bits at node 148 from the line 98 to control the functions in the integrator circuits 128. Frequency control bits from the DSP 54 on the line 98 are provided to the capacitor array 124 at node 150.

Although a feedback architecture may offer more out-of-band noise shaping, a feed-forward architecture gives more flexibility in designing a stable modulator. The passive resonator circuits 120 are employed because they have lower noise figures, higher linearity, require less power, and can operate at higher carrier frequencies than active resonators. The quality factor Q of the resonator circuits 120 is primarily set by the series resistance in the inductor 122. Simulations have shown that the resonator Q should be greater than 30 to achieve a deep notch characteristic and will require an off-chip component as it is difficult to achieve the needed performance with an integrated spiral inductor. Simulations also have shown that five sets of coefficients are needed to cover a 400 MHz RF band and the modulator 52 is stable across 100 MHz band, but an extra set allows for frequency overlap. The coefficient set information will be stored in a look-up table in the DSP 54. Control bits will be loaded and sent to the filter 74 to set the notch frequency and component parameters based on RF carrier information.

Figure 6:
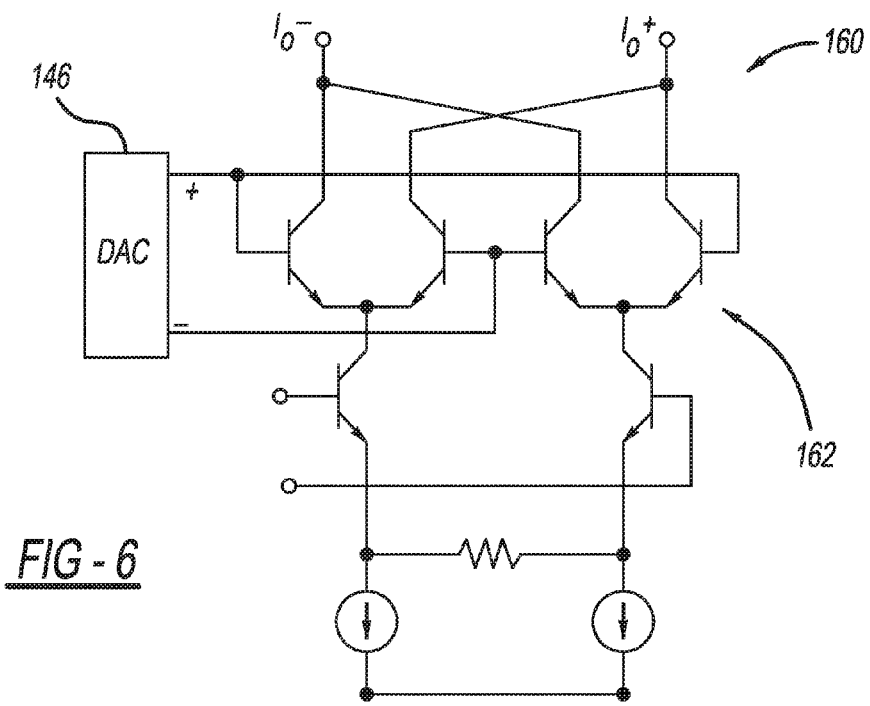
FIG. 6 is a schematic diagram of a tunable transconductance amplifier employed in the sixth-order filter shown in FIG. 5.

FIG. 6 is a schematic diagram of an amplifier circuit 160 implemented in the transconductance amplifiers 126 to show how the coefficients may be adjusted. The gain of the transconductance amplifiers 126 may be varied by applying a differential voltage to a cross-coupled pair of transistors 162. When the differential voltage is zero, there is no gain. For a large positive differential voltage, the amplifier 126 achieves a maximum positive gain and, conversely, for large negative differential voltage, the transconductance gain is maximized and inverted. The differential voltages are converted from the DSP control bits using the low-speed DAC array 146.

The inductors 122 will be fixed for each of the three RF bands in the signal paths through the triplexer 34 and the capacitance changed within each band through the capacitor array 124. The size, or more appropriately, the resolution of the capacitor array 124 will be fine enough for narrow frequency selectivity. FIG. 7 is a schematic diagram of one possible embodiment for the capacitor array 124 that provides coarse and fine tuning. The capacitor array 124 includes a plurality of capacitors 170 and switches 172, where the switches 172 are selectively controlled by the frequency notch control signal from the DSP 54 at node 176.

The order of the filter 74, the ratio of the sample rate to signal bandwidth and the number of bits in the quantizer circuit 100 are all chosen to provide a 100 dB dynamic range. The passive resonator circuits 120 with the inductors 122 and the capacitor arrays 124 offer lower-power and wider bandwidth operation. Post-processing, such as filtering, calibration and correction of the output digital data is performed in the DSP 54. The modulators 52 are able to meet the dynamic range requirements by reducing the magnitude of the unwanted transmit signal.

The architecture 68 shows that the transmitter module 48 includes an up-converter 180 that up-converts the digital data to be transmitted from the baseband processor 56 and a delta-sigma modulator 182 that modulates the bits in the manner as discussed herein. The modulated bits are then provided to a DWA circuit 184 and the bits are converted to an analog signal by a 4-bit DAC 188. The analog signal is filtered by the BPF 60 to reduce out-of-band emissions, and then amplified by the power amplifier 64 for the particular frequency band. The switch 66 and the other power amplifiers for the other bands are not shown in FIG. 3. A DSP 190 receives a digital signal from the DWA circuit 184 and provides an in-phase digital representation of the transmit signal for signal cancellation in the combiner 70, as will be discussed in further detail below. The up-converter 180, the delta-sigma modulator 182, the DWA circuit 184, the DAC 188 and the DSP 190 are all part of the transmitter circuit 62.

As mentioned, digital cancellation of the transmit signal is provided by the transceiver. If a transmit signal is occurring in the same frequency range through the same circulator 38 while the delta-sigma modulator 52 is receiving a receive signal on that channel, the transmit signal is also fed back to the combiner 70. Particularly, the bits from the DWA 184 that are processed by the DSP 190 are latched into a 4-bit delta-sigma DAC 80 by a latch 90 to replicate the transmit signal on the line 96 provided to the combiner 70. The DSP 190 delays the bits so that the bits converted by the DAC 80 and provided to the combiner 70 are in phase with the actual transmit signal when it is received at the combiner 70 to create a null at the frequency of the transmit signal in the receiver channel 50. The DSP 190 will periodically provide calibration bits to the DAC 80 to identify the particular phase at any given point in time, where that signal when processed by the receiver channel 50 will be identified by the DBP 56. By adjusting the phase of the calibration signal so a null is processed by the receiver channel 50 allows a delay in the processing of the digital bits in the DSP 190 to be in phase with the transmitted signal.

The adaptive cancellation technique leverages the fact that the digital sequence for creating the transmit signal is available and uses the inherent feedback path of the modulator 52. The transmit digital data from the baseband processor 56 is a modified sequence of the actual transmitted signal that has been altered based on the changing environment so that the replicated transmit signal, particularly the phase and strength, is a better approximation to the unwanted signal arriving at the receiver input. The modified transmit data sequence is then converted to an analog signal through the DAC 80. The amount of cancellation needed is determined by the linearity specification of the LNTA 72.

Reducing the signal level into the LNTA 72 eases the linearity requirements of the system for potentially higher dynamic range in the overall modulator. In some scenarios, digital cancellation may not offer enough reduction of the self-interferer. Additional cancellation is achieved by employing RF cancellation techniques in conjunction with digital cancellation techniques. In this embodiment, a small amount of the transmit signal is siphoned off through a coupler in the transmit path. The signal energy is used for envelope tracking to improve the linearity and efficiency of the power amplifier as well as for RF cancellation of the self-interferer. The RF cancellation circuitry modifies the transmit signal for better cancellation at the receiver input.

The combination of digital and RF self-interference cancellation can reduce the interferer by 30 dB with relatively little increase in the transceiver complexity. For a transmit power level of 25 dBm, the reflected signal from the antenna structure 32 into the receiver module 46 will be approximately 14 dBm, where a 3:1 VSWR and 1 dB cable loss are assumed. The cancellation schemes bring the unwanted signal power entering the receiver down to −16 dBm.

Figure 8:
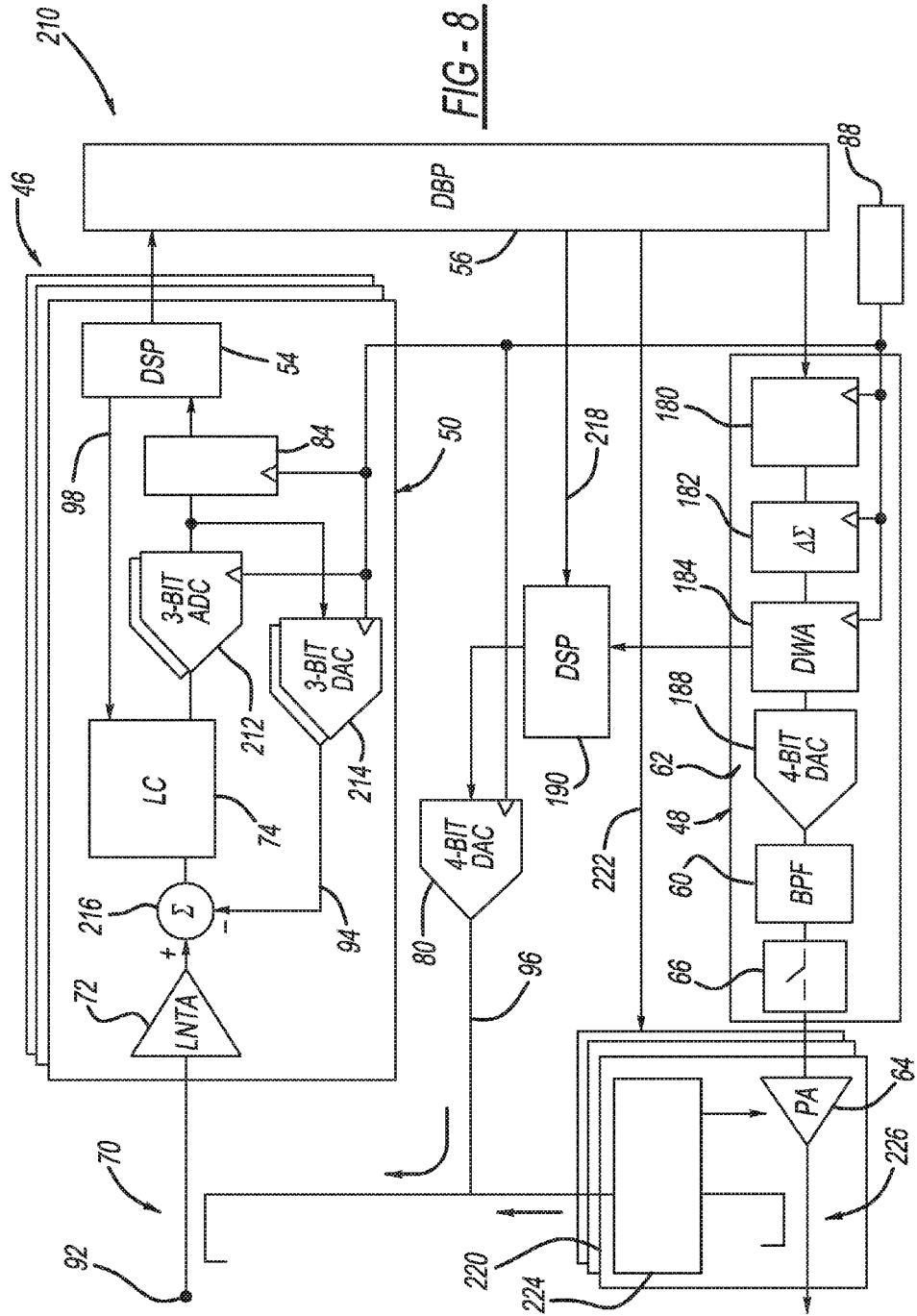
FIG. 8 is a block diagram of another transceiver for the radio architecture shown in FIG. 2 similar to the transceiver shown in FIG. 3 and including analog and digital self-interference cancellation functions.

FIG. 8 is a schematic block diagram of an architecture 210 similar to the architecture 68 illustrating a technique for providing the digital signal cancellation described above in combination with RF or analog signal cancellation, where like elements to the architecture 68 are identified by the same reference number. In this embodiment, the 4-bit ADCs 76 are replaced with 3-bit ADCs 212 and the feedback 4-bit DACs 78 are replaced with 3-bit DACs 214, which provides a different bit resolution for the quantization and interleaving process as discussed above. Also in this embodiment, the analog error signal on the feedback line 94 is provided to a summation node 216 after the LNTA 72 instead of being provided to the combiner 70 so that it is the amplified receive signal from the antenna 32 that is used to generate the error signal provided to the filter 74. In more traditional delta-sigma modulator architectures, where the LNTA 72 precedes the summation node 216 to create the error signal, the digital cancellation scheme may still be applied and is equally effective. In this embodiment, the injection of the reconstructed transmit signal is not coincident with the feedback signal in the receiver delta-sigma modulator 52. The advantage of this approach is that the combiner 70 is removed from the feedback path of the modulator 52 and does not introduce excess loop delay that could cause instability. The phase delay provided by the DSP 190 is controlled by the DBP 56 on line 218.

Modern complex signal modulation schemes, such as long term evolution (LTE) and OFDM, have a relatively large peak-to-average ratio (PAR). Modern complex signal modulation schemes also have signal modulation power levels that can vary significantly, resulting in high peak-to-average signal powers. This can create disadvantages, such as non-linear performance and inefficient power amplifier performance. In order to provide linear amplification in known transceivers, the quiescent operating point of the power amplifier 64 is usually reduced from its maximum power level to accommodate the high PAR of the incoming signal, which decreases its efficiency. A popular solution to mitigate this decrease in efficiency is to use envelope tracking (ET). Envelope tracking dynamically modulates the drain voltage of the power amplifier 64 according to its transmitted signal power level and the transmitter's baseband signal. As a result, the power amplifier 64 only consumes the necessary DC power during transmission, and thus the efficiency is greatly improved. Another advantage of envelope tracking is to incorporate the nonlinearity of the power amplifier 64 during the adjustment of the drain voltage of the power amplifier 64 to further improve its linearity.

For the reasons discussed above, envelope tracking is incorporated into the architecture 210 to provide feedback to the power amplifier 64 to improve the performance of the power amplifier 64. For example, the feedback can be used to adjust the operational point of the power amplifier 64, thus improving its efficiency and linearity. In addition, as will be discussed, the architecture 210 incorporates RF cancellation with the envelope tracking. In this implementation, the DBP 56 can both provide the information required to recreate the transmitted signal and/or the receive information. Thus, the architecture 210 has the capability to measure the non-ideal signal delays and distortion created by the system implementation, including antenna reflections and various impedance non-uniformities, and to provide digital corrections to account for these non-ideal conditions.

The architecture 210 provides RF analog cancellation of the transmit signal through an analog cancellation circuit 220, where, if needed, a separate RF cancellation circuit 220 is provided for each frequency band for each circulator 38, and where the particular power amplifier 64 is in the circuit 220 because it is tuned to that particular band. Envelope tracking as discussed above is incorporated into the circuit 220 that can be used to adjust the operational point of the power amplifier 64, thus improving its efficiency and linearity. In each of the circuits 220, a small portion of the transmit signal is tapped off by a coupler 226 and provided to an RF cancellation and envelope tracking circuit 224 that tracks the receive signal and the transmit signal to provide a modulation signal to the drain of the power amplifier 64, and provide a copy of the reflected transmit signal. In this implementation, the DBP 56 can both provide information required to recreate the transmitted signal and receive information from the RF cancellation and envelope tracking circuit 224. Thus, the architecture 210 has the capability to measure the non-ideal signal delays and distortion created by the system implementation, as referred to above. The processed tapped signal is provided to the combiner 70 along with the digital cancellation signal on the line 96 to remove the reflected transmit signal in the receiver channel 50 as much as possible. The circuit 224 also provides signal information to the power amplifier 64 to improve linearity and efficiency.

For the cellular application discussed herein that covers multiple assigned frequency bands, a transmitter with multi-mode and multi-band coverage is required. Also, many current applications mandate transmitters that rapidly switch between frequency bands during the operation of a single communication link, which imposes significant challenges to typical local oscillator (LO) based transmitter solutions. This is because the switching time of the LO-based transmitter is often determined by the LO channel switching time under the control of the loop bandwidth of the frequency synthesizer, around 1 MHz. Hence, the achievable channel switching time is around several microseconds, which unfortunately is too long for an agile radio. A fully digital PWM based multi-standard transmitter, known in the art, suffers from high distortion, and the channel switching time is still determined by the LO at the carrier frequency. A DDS can be used as the LO sourced to enhance the switching speed, however, this design consumes significant power and may not deliver a high frequency LO with low spurious components. Alternately, single sideband mixers can be used to generate a number of LOs with different center frequencies using a common phase-lock loop (PLL), whose channel switching times can be fast. However, this approach can only support a limited number of LO options and any additional channels to cover the wide range of the anticipated 4G bands would need extra mixtures. As discussed, sigma-delta modulators have been proposed in the art to serve as an RF transmitter to overcome these issues. However, in the basic architecture, a sigma-delta modulator cannot provide a very high dynamic range in a wideband of operations due to a moderate clock frequency. It is precisely because the clock frequency is constrained by current technology that this high frequency mode of operations cannot be supported.

Figure 9:
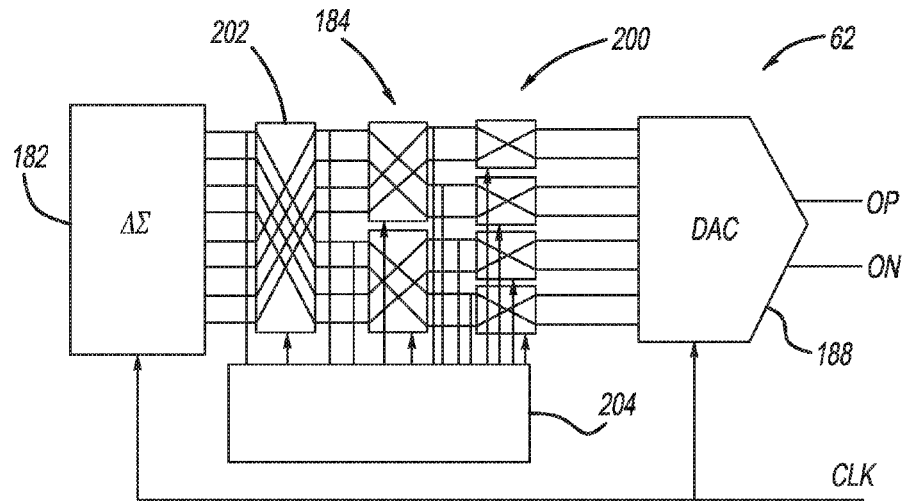
FIG. 9 is a schematic block diagram of a digital bandpass delta-sigma modulator for the transmitter module shown in FIGS. 3 and 8.

FIG. 9 is a schematic block diagram 200 of a portion of the transmitter module 48 showing the delta-sigma modulator 182, the DWA circuit 184 and the DAC 188. The DWA circuit 184 modulates the digital thermal codes to shape out voltage and timing mismatches among DAC weighting elements 202 that are controlled by a shape controller 204. The weighted digital bits are then provided to the DAC 188 that generates the analog signal to be transmitted.

The delta-sigma modulator 182 employed as an RF transmitter provides digital data that can be generated by a high speed processor or can be produced by a multi-rate digital signal processor. The interleaving architecture effectively increases the clock rate of the delta-sigma modulator, boosts the oversampling ratio, and in turn improves the achievable signal-to-noise ratio and dynamic range. In order to enable this interleaving architecture, an interleaving dynamic element matching (DEM) algorithm must be employed. Unlike conventional DEM algorithms that arrange the cells in one DAC, the interleaving DEM algorithm considers the used cells in all of the interleaving DACs, and arranges them to ensure there is no periodic pattern when using the cell.

Figure 10:
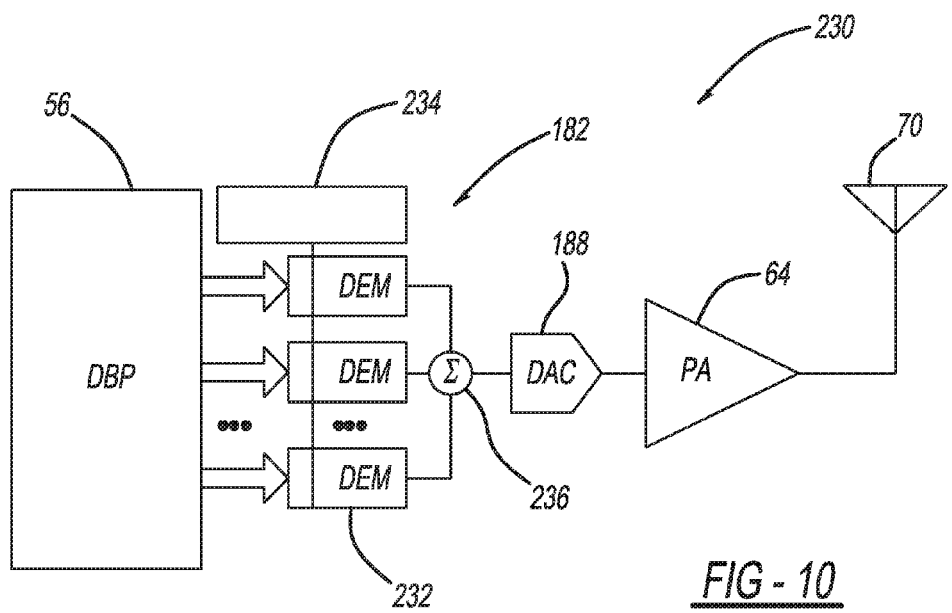
FIGS. 10-12 show three embodiments of a delta-sigma modulator employing an interleaving DEM algorithm for the transmitter module shown in FIGS. 3 and 8.

FIG. 10 is a schematic block diagram 230 of a portion of the transmitter module 48 showing the delta-sigma modulator 182, the DAC 188, and the power amplifier 64 illustrating an interleaving architecture. The DWA circuit 184 is not shown for clarity purposes. The digital signal to be transmitted from the baseband processor 56 is provided to a number of DEM circuits 232 in the delta-sigma modulator 182 to provide the dynamic element matching control provided by an interleaving control processor 234 at the slower clock rate. The signals are combined by a summer 236 and sent to the DAC 188 and then to the power amplifier 64. The DEM algorithm operating in the circuits 232 does not run at the highest clock rate, but instead the computation is distributed into the multiple circuits 232 running at a slower clock rate. The digital data is then multiplexed into one high speed data stream and fed into high speed data followed by the power amplifier 64.

Figure 11:
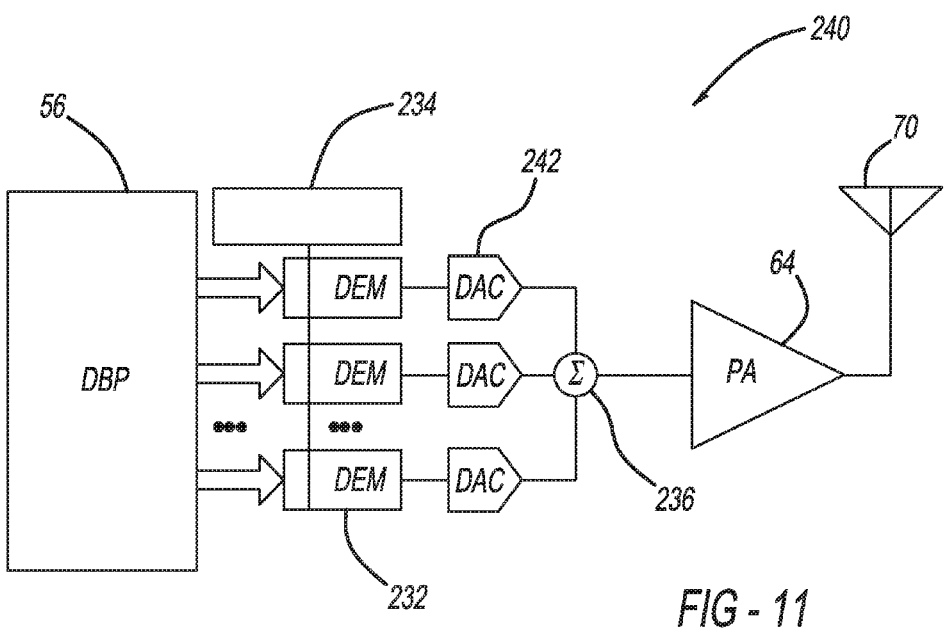

FIG. 11 is a schematic block diagram 240 of a portion of the transmitter module 48 that can replace the block diagram 230, where like elements are identified by the same reference number. In this design, three separate DACs 242, one for each of the DEM circuits 232, replace the DAC 188, where the summation junction 236 is provided after the DACs 242.

Figure 12:
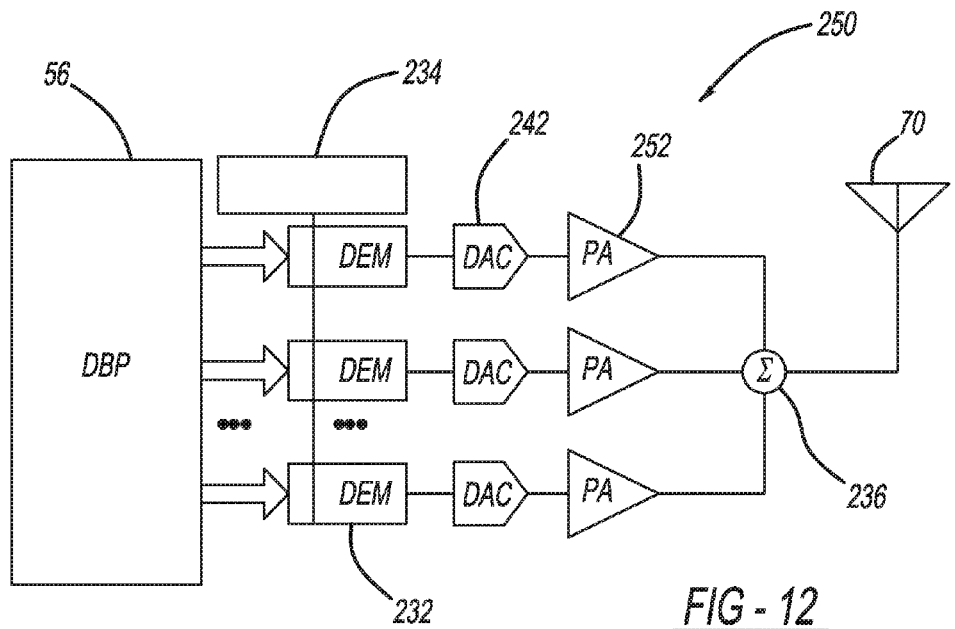

FIG. 12 is a schematic block diagram 250 of a portion of the transmitter module 48 that can replace the block diagram 240, where like elements are identified by the same reference number. In this design, three separate power amplifiers 292, one for each of the DEM circuits 232, replace the power amplifier 64.

The architecture 30 is designed to achieve 100 dB of dynamic range over 20 MHz signal band and RF carrier frequencies up to 2.6 GHz. The modulators 52 must be capable of detecting a small desired signal, such as −86 dBm, in the presence of a large unwanted interference signal, such as 14 dBm. However, when the operating scenario does not demand as much from the hardware, i.e., smaller signal bandwidths, the power dissipation in the transmitter module 48 should be reduced. There are two primary approaches for adjusting power dissipation including reducing functionality or reducing performance. Reducing functionality is a matter of reconfiguring the architecture to bypass or disable unneeded circuitry. Reducing performance includes modifying the architecture 30 to operate with decreased supply current or voltage thereby trading off performance for power. As will be discussed below, the present invention proposes several techniques in both of these categories that may be used to reduce power in the software-programmable cellular radio as discussed herein.

A first power reduction technique includes reducing the order of the filter 74 in situations where full dynamic range is not required. Particularly, the sixth-order LC filter 74 can be reduced to a fourth-order or a second-order filter by powering down following resonator stages. For example, by disabling the last group of the resonator circuit 120, the amplifier 126 and the integrator circuit 128, represented by dotted box 228 in FIG. 5, would reduce the filter 74 from a sixth-order filter to a fourth-order filter. A separate power supply may be used to completely shut down some circuitry while other circuitry could remain on, but at minimal power consumption.

A second power reduction technique is to reduce the bit resolution of the quantizer circuit 100 from 4-bits to one bit. For this power reduction technique, only one of the bits in the 4-bit quantizer circuit 100 is employed to reduce power. For example, a center one of the comparators 102 in the circuit 100 determines the zero cross-over point and is required for the one-bit operation. All of the other comparators 102 and most of the latches 104 and 110 may be turned off. All of the DAC current switches must remain active and be driven by the most significant bit (MSB) path to keep the modulator stable. For the 1-bit, 3-bit or the 4-bit operation, the tail currents in the switches may be decreased when the receive signal is not large, such as when the radio is not transmitting.

Varying the clock rate to reduce static power dissipation is another proposed technique to reduce power consumption. The impact on the delta-sigma ADC architecture for this technique includes that at a slower clock rate the quantizer circuits do not need to be interleaved, and fewer stages of de-multiplexing is required. The only reason interleaving is provided is to support fast sampling rates for high RF carrier frequencies. At lower RF carrier frequencies, the clock rate may be reduced and the interleaved quantizers disabled. If the clock rate is sufficiently slow, a one-to-two (1×2) demultiplexer may be all that is needed to interface with the DSP 54 as will be described below.

Figure 13:
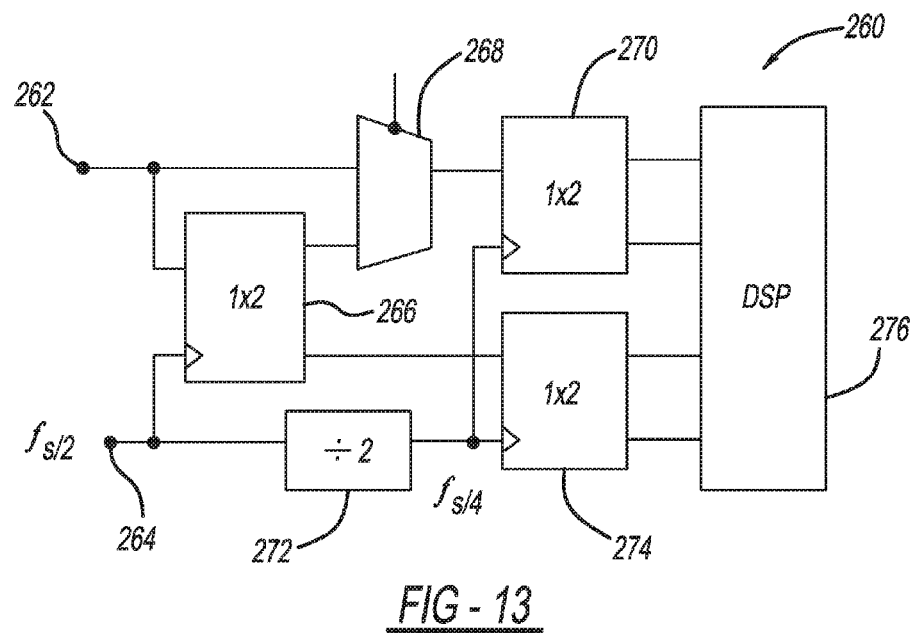
FIG. 13 is a schematic diagram of a timing circuit that can be employed in the delta-sigma modulator shown in FIGS. 3 and 8.

FIG. 13 is a schematic block diagram of a 1×4 demultiplexer circuit 260 that can be reconfigured as a 1×2 demultiplexer circuit to reduce power dissipation for slower clock rate operation in the manner discussed herein. The demultiplexer circuit 260 receives the data to be clocked in at node 262 and a one-half divided clock signal at node 264. The data is provided to a 1×2 demultiplexer 266 and a selector 268, where the demultiplexer 266 is clocked at the one-half clock signal. The selector 268 selects the normal data at the node 264 or the demultiplexed data from the demultiplexer 266, and outputs the selected data to a 1×2 demultiplexer 270. The one-half clock signal at the node 264 is divided by two by a divider 272 to generate a one-fourth clock signal that clocks the demultiplexer 270 and a demultiplexer 274. Outputs from the demultiplexers 270 and 274 are provided to a DSP 276. When the normal data is selected, the demultiplexers 266 and 274 need not be powered.

In other power-saving techniques, the present invention proposes trading performance for power consumption in relaxed operation scenarios. As an example, in a maximum performance mode the input intercept point of the LNTA 72 has about a +25 dBm to support 100 dB of dynamic range while achieving a low-noise figure. If the constraint on linearity or noise can be eased, then a substantial amount of power can be saved. Two scenarios are considered to accomplish this. In the first scenario, the receive signal is well above the noise floor and the required dynamic range is less. In the second scenario, there is no unwanted transmitted signal so the maximum expected input level will be lower. In both scenarios there is a relief in design for a high third-order intercept point that can be translated to reduced current, supply voltage or both.

Performance may also be traded for power savings in the DACs 78 or 214. Since errors in the DACs 78 or 214 are not shaped by the filter 74, the DAC performance must equal or exceed the modulator performance. To achieve this performance, dynamic element matching provided by the DEM circuits 232 is incorporated in the DAC design as discussed above. Mismatches among nominally identical circuit elements inevitably introduced during circuit fabrication cause non-linear distortion. By scrambling the usage pattern of the elements, the DEM circuits 232 cause the error resulting from the mismatches to be pseudo-random noise that is uncorrelated with the input sequence instead of non-linear distortion. If operation conditions require less dynamic range, a lower-power simplified scrambler would be sufficient.

Another proposed method for programmable power efficiency in the radio architecture 30 includes disabling the transmit cancellation scheme. The cancellation scheme is implemented in part by the DAC 80 for reducing self-interference. Cancellation is only necessary if the transmit signal is in an adjacent band, is at full output power, and the reflection from the antenna structure 32 is poor. Under these conditions, there must be cancellation so that the modulator 52 can linearly process this unwanted interference as it appears at the receiver module 46 so that the DSP 54 can process it further. The delta-sigma modulator 52 may be programmed to employ any combinations of the techniques for optimizing power efficiency in the transmitter of an automotive wireless cellular communications system. An important scenario is when the transceiver module 44 is in an idle state and all of the power-saving techniques are in effect. In such a scenario, the delta-sigma modulator 52 will require only minimal functionality.

Although the RF industry has rapidly progressed with regard to compact radio architectures, existing front-end components, such as power amplifiers, low noise amplifiers and filters still limit the bandwidth in dynamic range of these components. A single RF front-end capable of wide bandwidth sampling has been contemplated before, but the device technology was not sufficiently developed to allow the design and integration of a multi-function radio that would be suitable as a cellular handset. As discussed, an integrated front-end RF module would need 111-125 dB of dynamic range for 20 MHz of signal bandwidth. CMOS cannot come close to this requirement and is moving in the wrong direction. GaAs technology is getting closer, but still falls short.

To overcome these limitations, the present invention leverages three unique innovations as discussed above, namely, an inherently wideband architecture with direct sampling using delta-sigma modulators, highly linear based power amplifiers and input transconductor amplifiers, and tunable/programmable filters. Based on these innovations, some of the components of the architecture 30 will be fabricated in silicon germanium (SiGe) technologies to provide the desired performance and power handling and some of the components will be fabricated in the CMOS technology, which is lower cost. It is noted that other semiconductor material technologies may be applicable, such as indium phosphide technologies (InP). The present invention proposes that the low-power delta-sigma modulators 52 incorporate a SiGe design and fabrication processes and provide 200 GHz FMAX that provides sufficient head room to enable new feedback linearization techniques. Further, on the transmitter side, SiGe provides system design flexibility over other technologies. The proposed software defined front-end transceiver module 44 is enabled by tightly integrating SiGe technology with silicon (Si) CMOS. Generally, those devices, components and devices that operate at the higher frequencies, such as 5.2 GHz, including the combiner 70, the LNTA 72, the filter 74, the tunable bandpass filter 60, etc., employ the SiGe technology and the components and devices that operate at the lower frequency, such as 1.3 GHz, employ the CMOS technology.

The modulators 52 will predominately be implemented in SiGe technology where it is necessary to meet the challenging dynamic range requirements across a signal bandwidth of 20 MHz at frequencies up to 2.6 GHz. Backend processing of the receive data in the DSP 54 will be implemented in 40/45 nm CMOS. A combination of SiGe and 40/45 nm CMOS will be used in the transmitter module 48. The SiGe supports broader frequency tuning and offers higher gain for improved linearity. The DWA circuit 184 and the transmit DAC 188 will be implemented in 45 nm CMOS for highest power efficiency.

In one implementation, CMOS technology is employed to realize the data modulation, dynamic element matching algorithms, and fabrication of the DACs to achieve a low power realization. SiGe technology is implemented in the receiver modulator filters and the transmitter tunable bandpass filter 60 for high speed operation. An enabling technology to allow the integration of the SiGe fabrication techniques and the 40/45 nm CMOS fabrication techniques is referred to as micro-bump integration technology. The interleaving sigma-delta modulators can use the micro-bump technology discussed below. Separate circuit fabrication can proceed in parallel without modification and then tightly integrated with an integration technology for low parasitic performance.

Figure 14:
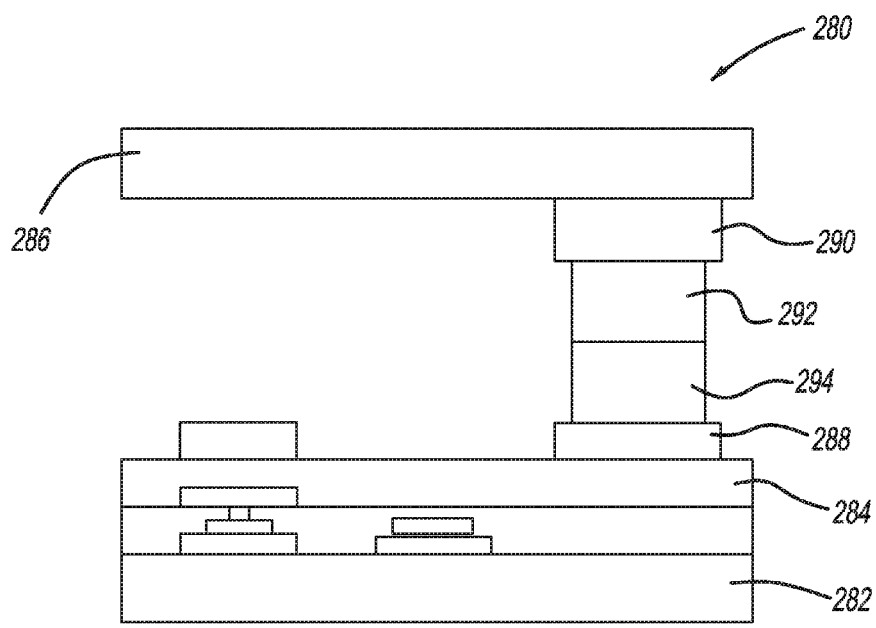
FIG. 14 is a profile view of a semiconductor device showing integration between CMOS and SiGe technologies.

FIG. 14 is a profile view of a semiconductor device 280 showing integration between SiGe and advanced CMOS technologies through a known micro-bump integration technique. The device 280 includes an SiGe substrate 282 on which is deposited SiGe device layers 284 and a CMOS substrate 286. A metal contact layer 288 is deposited on the device layers 284 and a metal contact layer 290 is deposited on the CMOS substrate 286. The substrates 282 and 286 are integrated together through a micro-bump 10 μm I/O pad layers 292 and 294 having a 20 μm pad pitch.

The present invention also proposes using reconfigurable field programmable analog arrays (FPAA) including gm cells in a delta-sigma modulator. FPAAs provide a digitally controlled method to adaptively connect various analog cells, with a transconductance, thus enabling flexible circuit configurations. Details are provided for a technique of using a FPAA including gm cells in a delta-sigma modulator to assess, and then adjust the architecture for adaptive operation. As used herein, a gm-array is an array of electronic components ("gm cells") employed for their transconductance (commonly identified as "$g_m$") properties, where the gm cells can be designed in any suitable technology to convert an input voltage to a representative output current. With the proposed invention, the transceiver in an automotive wireless cellular communications system, or other dynamic signal environment, can be reconfigured for evolving communications standards or changes in power profiles and have optimized performances at all operational scenarios.

Traditionally, delta-sigma modulators are designed with a fixed architecture, i.e., the order, the number of quantizer bits, etc., while the filter coefficients can be changed to move the center frequency and vary the signal bandwidth. The innovation described herein offers a way to reconfigure the modulator architecture and optimize the coefficients for a new modulator architecture. The invention uses an array of digitally controlled analog gm cells. The array of analog gm cells can be selectively activated or deactivated, and thus enable extreme flexibility in an adaptive, real time manner. Dynamic reconfiguring of the array enables the filter order of the modulator to be changed, compensations paths to be created (e.g for better stability), and signal paths to be disabled to allow system calibration in an open-loop condition.

Programmable arrays, such as SRAM and FPGAs, have been used for some time in digital systems. More recently, programmable analog arrays are being used for rapid prototyping of analog functions. It is also known in the art to use an array of operational transconductance amplifiers (OTAs) to create the integrators and active resonators in a delta-sigma modulator. The innovation disclosed herein extends this idea to passive inductor-capacitor (LC) architectures and introduces the concept of using the gm-array for calibration in addition to architecture reconfiguration.

The extension of using a reconfigurable gm-array for calibration is not obvious. Inspiration comes from applications where the delta-sigma modulator architecture in the transceiver must adapt to meet extremely stringent performance specifications in one scenario and require ultra-low power in another, such as with cellular or mobile devices.

Figures 15A, 15B:
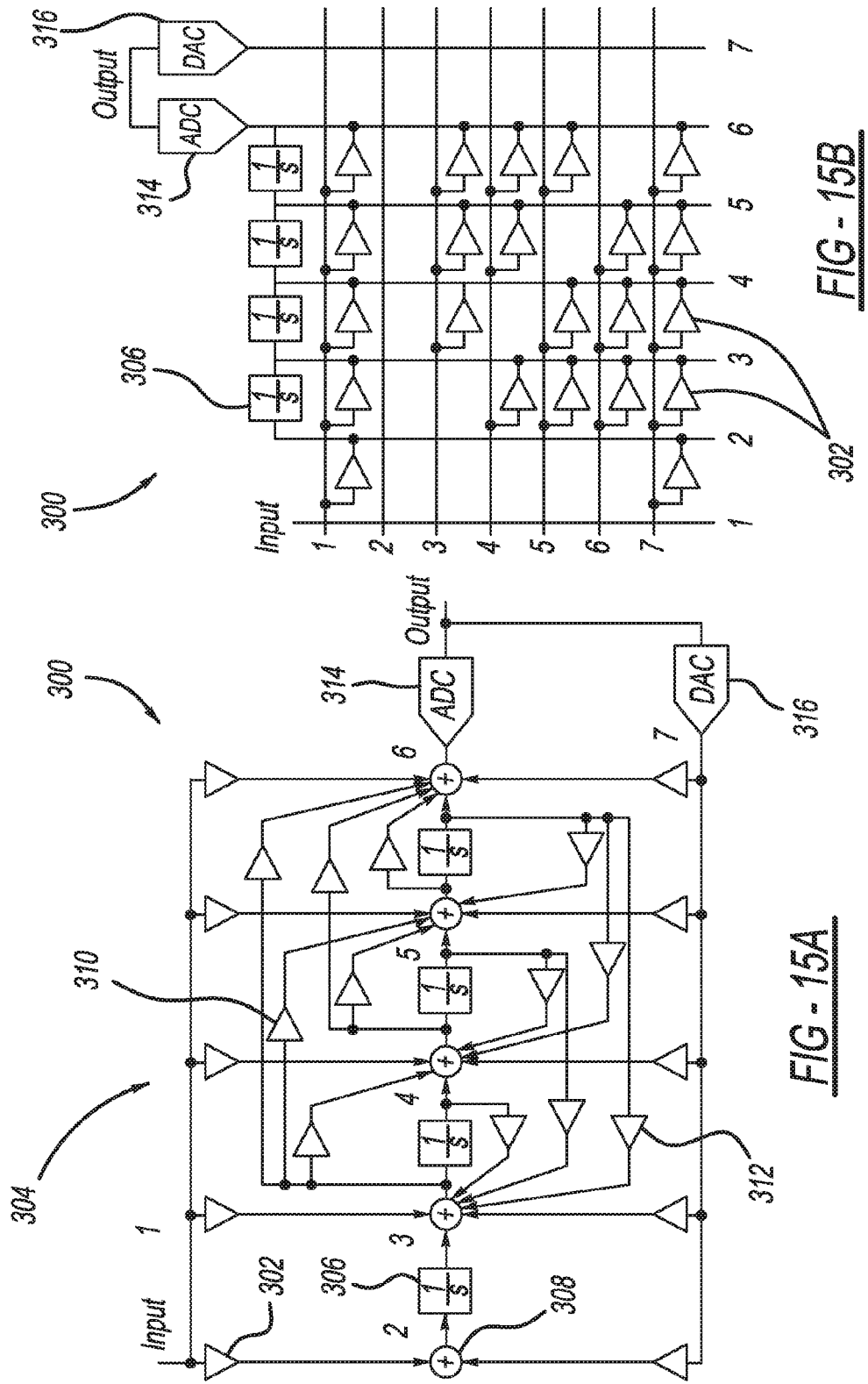
FIGS. 15A and 15B are schematic diagrams of a delta-sigma modulator including an array of gm cells.

FIG. 15A is schematic diagram of a generic continuous time delta-sigma modulator 300 having a filtering function and a quantization block. The filtering function is depicted by a filter 304 including an array of gm cells 302, integrators 306 and summation junctions 308. The array of gm cells 302 includes a number of feed-forward gm cells 310 and a number of feedback gm cells 312. An ADC 314 operating as the quantization block converts the filtered analog signal to a digital signal at an output of the modulator 300, and a DAC converts the digital output of the ADC 314 back to an analog signal for feedback purposes.

FIG. 15B is an equivalent circuit of the modulator 300, shown in an array configuration, where like elements are identified by the same reference number. Nodes in the circuit are numbered 1-7 in FIG. 15A and correspond to the node numbering in FIG. 15B. By deactivating some of the gm cells 302, the modulator 300 can be configured as a cascade-of-integrators, feedback form (CIFB), or as cascade-of-integrators, feed-forward form (CIFF). The modulator 300 can also be reduced to a lower order filter by deactivating selected ones of the gm cells 302, discussed in detail below. Elements of the delta-sigma modulator 300 can be used as building blocks for the delta-sigma modulator 52 shown in FIG. 3.

For ease of explanation, a less complex delta-sigma modulator will be used to explain the core idea of the invention. FIG. 16A is a schematic diagram of a 4th order delta-sigma modulator 320 and FIG. 16B is an equivalent circuit to the modulator 320 shown in FIG. 16A along with the digital filtering functions shown as part of the DSP. The modulator 320 includes an input summation junction 326 with a first resonator stage 322 and a last resonator stage 348 each having three gm cells 324 and an LC integrator circuit 328. Further, a feed-forward gm cell 332 couples the first stage 322 to the last stage 348, as shown, and a feedback gm cell 334 provides feedback from the last stage 348 to the first stage 322. The current output of each of the gm cells 324 are added together in the summation junction 326 along with a feedback signal from the last stage 348 or a feed-forward signal from the first stage 322, as shown. A resistor 330 converts the current to a voltage for quantization purposes, an ADC 336 converts the filtered analog signal to a digital signal for further processing, and a DAC 338 converts the digital signal to an analog signal for feedback purposes.

The modulator 320 operates as a multiple stage filter similar to the filter 74 discussed above, where certain ones of the stages 322 and 348 can be removed from the filtering process when high performance is not required. Particularly, the gm cells 324 are controlled by a coefficient logic function controller 340 that can assign negative, zero or positive transconductance values to the gm cells 324. When a gm cell 324 has a zero transconductance value, the cell 324 is deactivated or open. The bias current for the gm cells 324 is controlled by a current source routing network 342 that selectively directs current to the gm cells 324 from current sources 344 in order to optimize power dissipation while maintaining common voltages, as will be discussed in further detail below. A DSP 346 controls the modulator. In this manner, the modulator 320 is independent of the array configuration.

Two examples of how the 4th order modulator 320 can be reconfigured for different operations are discussed below. The first example illustrates how the gm-array can be used to optimize power dissipation by reducing the architecture complexity during scenarios where the transceiver does not require high dynamic range performance. As shown in FIGS. 17A and 17B, the 4th order modulator 320 of FIGS. 16A and 16B is reduced to a 2nd order modulator 350 by bypassing a second resonator stage 352 using the coefficient controller 340 to deactivate some of the gm cells 324, where the gm cells 324 shown in dashed lines have a zero-transconductance and the active gm cells 324 shown by solid lines have different coefficient values for the new filter order. Therefore, by removing one or more of the stages 322 to reduce the order of the filter, some of the feedback signals are not provided, and the complexity of the filtering process is reduced.

Figures 18A, 18B:
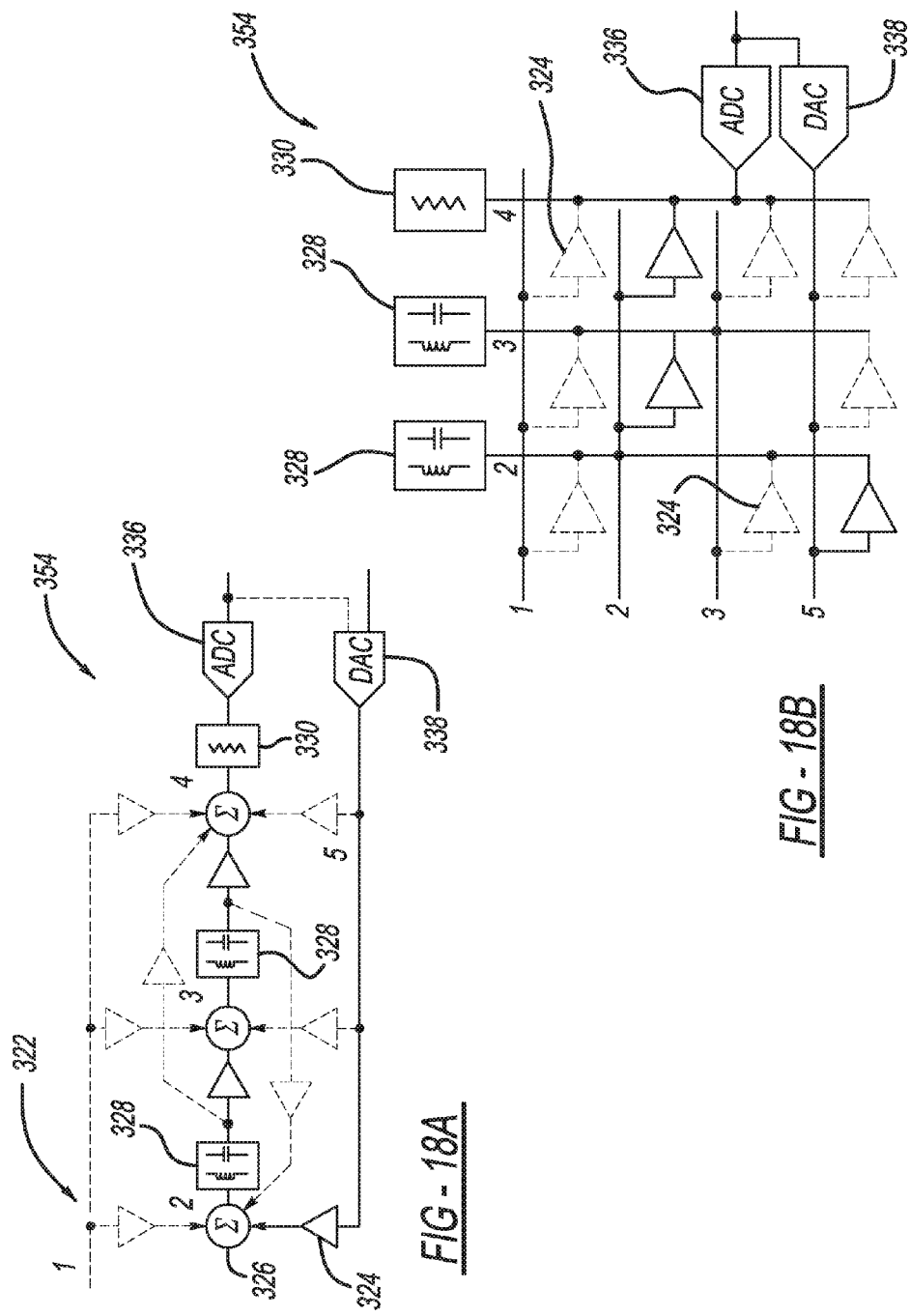
FIGS. 18A and 18B are schematic diagrams of the fourth order delta-sigma modulator shown in FIGS. 16A and B where the array of gm cells is controlled to optimize dynamic range.

The second example illustrates how the reconfigurable gm-array can be used to optimize dynamic range for variable environmental conditions. FIGS. 18A and 18B are schematic diagrams of a delta-sigma modulator 354 showing this embodiment, where like elements are identified by the same reference number. As the transceiver changes its environment, for example, the temperature increases, the circuit component characteristics will change. During a non-receive mode, a training code can be applied to the DAC 338 and the output of the ADC 336 is evaluated. During this operation, a number of the gm cells 324 can be deactivated, as indicated by the dashed lines. The quantified delay—also known as the excess phase delay—can be used to recalculate the coefficients and optimize the performance. Many other calibration configurations can be used to quantify individual circuit components.

Referring back to FIGS. 16A and 16B, the discussion now focuses on the current source routing network 342, which controls the dc currents in the gm-array. In all of the active gm cells 324, the dc current must be sufficient to maintain linearity for all signal levels. Traditionally, the modulator 320 is designed for the most challenging conditions, for example, during operation at the lower frequencies of the RF band when the gm coefficient values are the highest, and in all other conditions the dc current is in excess. The proposed invention incorporates smart-dc operation by redirecting current from the dc current sources 344 to the gm cells 324 with higher transconductance values. This feature is particularly important when the array configuration changes and the dc current to the deactivated cell is wasted.

Figure 19B:
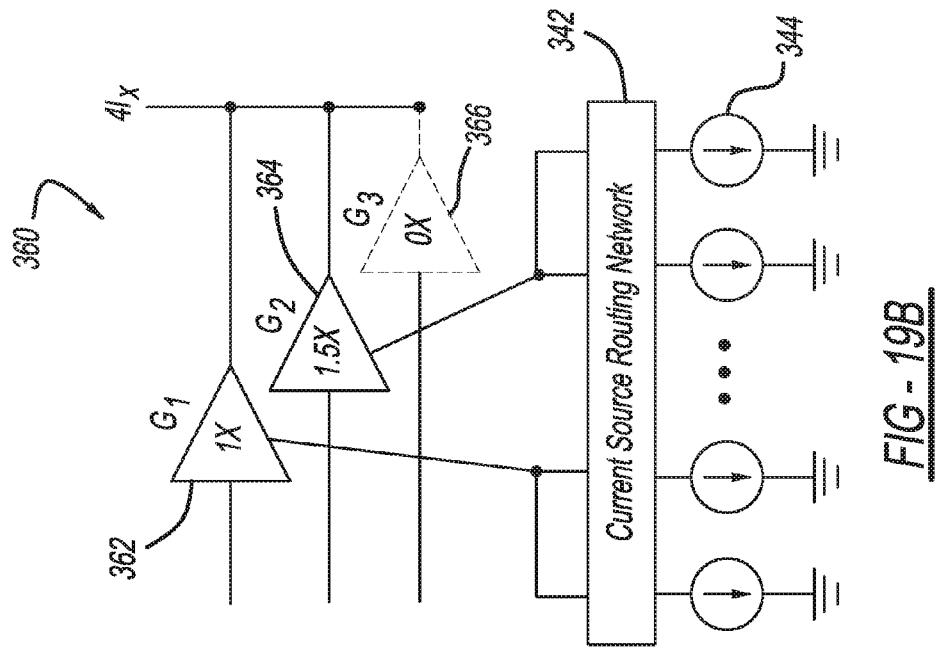
FIGS. 19A and 19B are schematic diagrams of a delta-sigma modulator where a current controller redirects current from inactive gm cells to active gm cells in order to optimize power consumption.
Figure 19A:
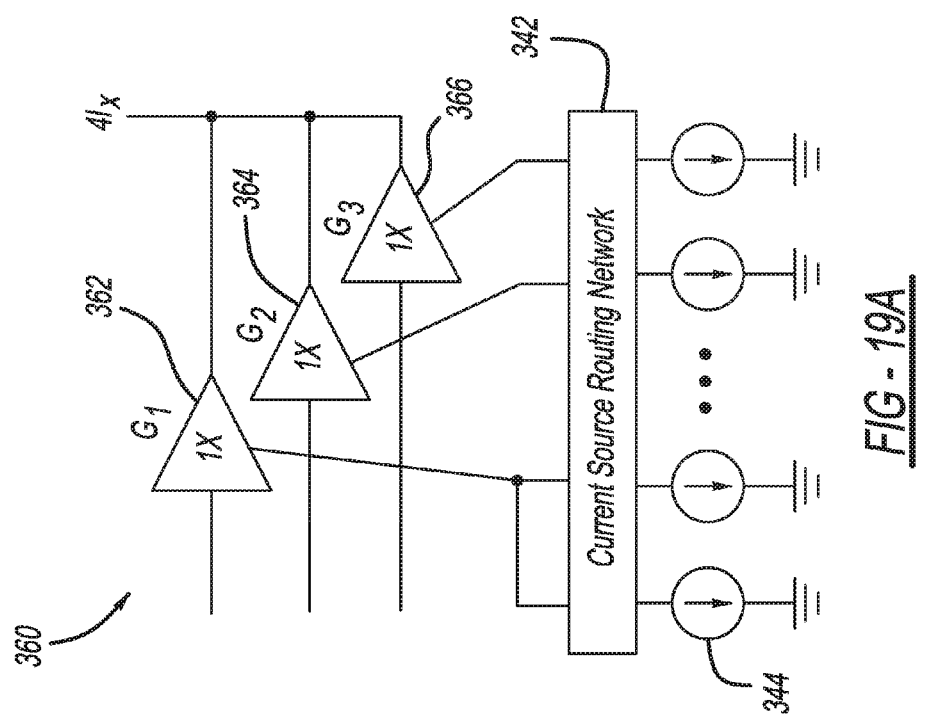

An example of this embodiment is shown as delta-sigma modulator architecture 360 in FIGS. 19A and 19B. In the architecture 360 shown in FIG. 19A, gm cells 362-366 are active and the dc current from the current source routing network 342 is sufficient to provide linear operation. In the architecture 360 shown in FIG. 19B the array is reconfigured where the gm cells 362 and 364 are activated and the gm cell 366 (G3) are deactivated, where the coefficient value of the gm cell 374 (G2) is 1.5× its original value. The dc current from the gm cell 366 has been re-directed to support the higher transconductance value of the gm cell 364. The redirection of the current keeps the output common mode voltage into the quantizer constant. In this example, the dc power does not change, however, a more sophisticated network can be designed to work with selectable load impedances to reduce dc power without affecting the common mode voltage.

Also proposed herein is a novel digital method that will correct and reduce distortions in power amplifiers, such as the power amplifier 64, used in the transmitter chain. The method will further improve the dynamic range and linearity of the power amplifier. Power amplifiers are typically used for amplifying and transmitting communications waveforms in the radio frequency front-end of a cellular network system, but the following discussion is not restricted to this application. The target applications are broadband power amplifiers, but where only a small fraction of the bandwidth is used at any given time. The method is independent of the modulation scheme used for the particular waveform of interest. A software based power amplifier driver is proposed herein that is a small, inexpensive, low-power communications device capable of handling multiple communications standards.

Traditionally, for cellular telephony, different modes and bands of operations have been supported in hardware by having essentially multiple disparate radio front-ends and baseband processing chips integrated into one platform (e.g. tri-band or quad-band user handsets supporting GSM, GPRS, etc.), as discussed previously relative to the architecture 10 shown in FIG. 1. Note that the static architecture 10 of FIG. 1 is critically dependent on narrow-band filters, duplexers and standards-specific down-conversion to IF stage. The main disadvantage of this static, channelized approach is it's inflexibility with regards to changing standards and modes of operation for mobile communications devices. As the cellular communications industry has evolved from 2G to 3G and 4G and beyond, each evolving waveform and mode has required a redesign of the RF front-end as well as expanding the baseband chipset capability, thus necessitating a new handset. For automotive applications, and other applications with long lifespans, this inflexibility to support emerging uses is prohibitively expensive and a nuisance to the end-user. The architecture proposed herein would overcome this limitation by doing away with static filters and duplexer technology and instead use a wideband sampling capability akin to software-defined radios, and yet provide the high dynamic range, sensitivity and optimized performance that is needed for modern communication systems, such as 4G and beyond end-user terminals.

Prior technologies in software-defined radio architectures have been proposed and pursued in non-automotive applications, but a zero-IF approach has proved technically difficult. Known software defined radios have typically focused on seamless baseband operations to support multiple waveforms and have assumed simpler down-conversion-to-baseband specifications. For the transmitter side, parallel power amplifier chains for differing frequency bands have typically been used for supporting different waveforms standards. The approach taken herein will replace the multiple power amplifiers with a single amplifier.

Figure 20:
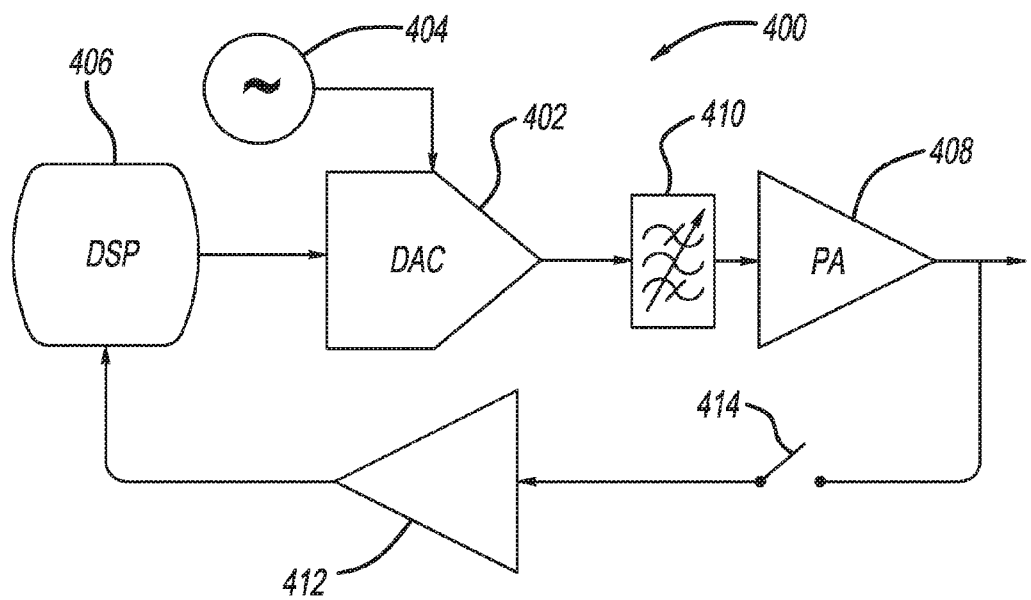
FIG. 20 is a schematic block diagram of a transmitter module including a calibration feedback loop from a power amplifier output back to a digital signal processor.

FIG. 20 is a schematic block diagram of a transmitter module 400 that can replace, for example, the transmitter module 48 in the architecture 68, where a DSP 406 operates in a similar manner to the DBP 56, but with enhanced functions. The DPS 406 provides the digital bits and symbols to be transmitted to an N-bit DAC 402, where in this non-limiting example, the DAC 402 is a 4-bit DAC running at a 5 GHz sample rate provided by a clock 404. The bandwidth of the signal can vary, for example, from 20 MHz to over 100 MHz. The ratio of the sampling clock frequency (5 GHz) to information bandwidth results in a signal that is oversampled in this particular case by a factor greater than 50 times. The output of the DAC 402 is provided to a tracking tunable bandpass filter 410 that removes any noise or other signals outside of the frequency band of interest, and can be an active or passive device. For simplicity and ease of configuration, it is suggested that an active bandpass filter be used. The filtered analog signal to be transmitted from the filter 410 is then sent to a power amplifier 408 to be amplified for transmission in the same manner as discussed above. Since power amplifiers vary in performance due to process variations, the DSP 406 will need to run a calibration cycle to determine the proper coefficients that are needed. The nonlinearities can be fully characterized by running a calibration sequence, where a calibration feedback device 412 provides feedback to the DSP 406 when a calibration switch 414 is closed.

In this manner, the module 400 provides the ability to self-calibrate the transmitter and reduce errors in the transmitted signal path. The module 400 does this by during a calibration sequence where the switch 414 is closed, and the generated transmit signal is sent back to the DSP 406 for comparison with the desired signal. Any deviations therebetween would then be digitally corrected, and a calibration table would be created for future transmit signals.

In this non-limiting embodiment, the DSP 406 can be a fully digital CMOS circuit customized with a high-speed output interface that generates a 5 GHz 4 bit binary code data stream into a 16 bit thermal code that drives the DAC 402. The DSP 406 also implements an infinite impulse response (IIR) algorithm to lower the noise floor in the vicinity of the signal. Further, the DSP 406 can optionally implement a DEM mechanism, which scrambles the thermal code output to improve the linearity of the DAC 402. The output of the DAC 402 is a differential analog signal with a significantly enhanced signal-to-noise ratio in the vicinity of the signal frequency (>90 dB). By using direct RF conversion, additional non-linearities and frequency (filter) restrictions of an up-converter (mixer) system are avoided, thus enabling a compact single solution. Note that this improves on current cellular systems that use multiple mixing stages to cover different bands. This proposed filtering technique and associated DSP software is a compact, inexpensive solution, and well suited for low-power communication devices capable of handling multiple communication standards.

This calibration sequence could be part of the initial power-on sequence for the amplifier 408. An additional advantage of the calibration process is that depending where the samples are taken it can remove nonlinearities beyond the power amplifier 408, for example, to include the signal path from the power amplifier 408 to, for example, the antenna 32 in FIG. 2. The DSP 406 performs two very important but independent functions including noise-shaping the output of the DAC 402 to remove the quantization noise in the immediate vicinity of the signal, thus improving the dynamic range and signal-to-noise ratio (SNR), and generate data that is pre-distorted to compensate for the non-linearity of the amplifier 408. Thus, the DSP 406 pre-distorts the input signal to compensate for the power amplifier non-linearities (and/or additional non-linearities due to downstream components, e.g. the antenna).

The present invention also proposes calibrating the tuning components in a radio frequency (RF) transceiver based on tunable bandpass delta-sigma, i.e., zero intermediate frequency, data converters. Specifically, three issues are considered including the calibration and correction scheme for the resonators, filters and other analog components in the transceiver chain, high power mode (>0 dBm) calibration of the transmit chain, and the role of the precision clock source driving the timing throughout the transceiver.

The delta-sigma based transceivers discussed herein are devices that have been designed to be software tunable and be able to support mobile handset-like waveforms (e.g. LTE, WCDM) and other wireless waveforms that have widely varying data reception and transmission protocols. For example, the center frequency of the carrier wave can range from below 400 MHz to over 3 GHz, and the waveform output powers can be as high as 23 dBm, while simultaneously ensuring the receiver still has ultrafine sensitivity with a dynamic range that can exceed 100 dB. For these reasons, an accurate, repeatable and adaptable calibration and correction scheme is needed to ensure the proper operation of the RF transceiver. These techniques, as they relate to receive signals, can also be used in receive only devices, for example, TV.

A novel mechanism is proposed that includes the incorporation of digital domain interference cancellation modules, high precision clocks locked to low phase noise feedback loops and low linearity switches integrated to triplexer/multiband modules to characterize the transmit, receive and feedback paths for accurate calibration and adaptive compensation of the transceiver.

This proposed mechanism can enable calibration and correction schemes for analog and mixed signal components in a delta-sigma data conversion based RF transceiver and for receive-only applications. By using a hybrid mixture of analog tuning components coupled with digital predistortion and calibration methods, the frequency, phase and gain accuracy of the signals being processed in the receive and transmit portions of the transceiver chain are ensured. It is vital to ensure that the parameters being used to generate and process the waveforms actually generates and processes waveforms that are in strict compliance with the standards based communications protocols for which the transceiver is designed to interface and operate with, for example, cellular and LTE. The advantage of this approach over what has been done previously is that it allows a system level calibration of the various components of the zero-IF receiver architecture, and takes advantage of the unique wideband data converter architecture to simplify what would otherwise be difficult individual calibration processes.

Traditionally, the transceivers that have been used for mobile communications applications have all been staged down-conversion type devices with local oscillators, mixers, pre-election filters, etc. to handle different communications waveforms and frequencies. The calibration procedures for such architectures are well known, and essentially serve to compensate for the errors generated by the non-linear elements in the signal path, i.e., the mixer, gain blocks, etc. They also calibrate for deviations in the components due to fabrication process variations for the different analog filtering elements. The great majority of these techniques involve two approaches including the generation of known "tones" or reference signals that are then passed through the transmit and receive chain, and a corresponding measurement block (square power detector, threshold, etc.) that measures deviations from the reference parameters. This loop-back method is used to set the calibration parameters of the various elements in either the transmit or the receive path of the transceiver. A modified second approach involves digitizing the response of the various units in the transceiver chain by utilizing the data conversion elements already present in the architecture, and then processing the error vector all in the digital domain to extract the calibration parameters. Subsequently, the transmit signal is appropriately predistorted or gain/feedback elements are reset so that the desired response is iteratively found for the RF path in question.

The approach discussed herein extends beyond the traditional techniques described above as it deals with delta-sigma architectures that operate in a bandpass mode at the RF center frequency of the carrier. Therefore, traditional issues with mixers and local oscillator calibration are not applicable because typical corrections for mixer distortion, I/Q mismatch, etc. that have been considered in the prior art are not applicable to the disclosed zero-IF system. Instead, frequency stability of the bandpass mode, ability to characterize the distortion for higher power operation modes, coupling behavior with the triplexer, or other multiband combiner, all require methods for error/drift detection, characterization and compensation on a dynamic basis not considered in other systems.

Figure 21:
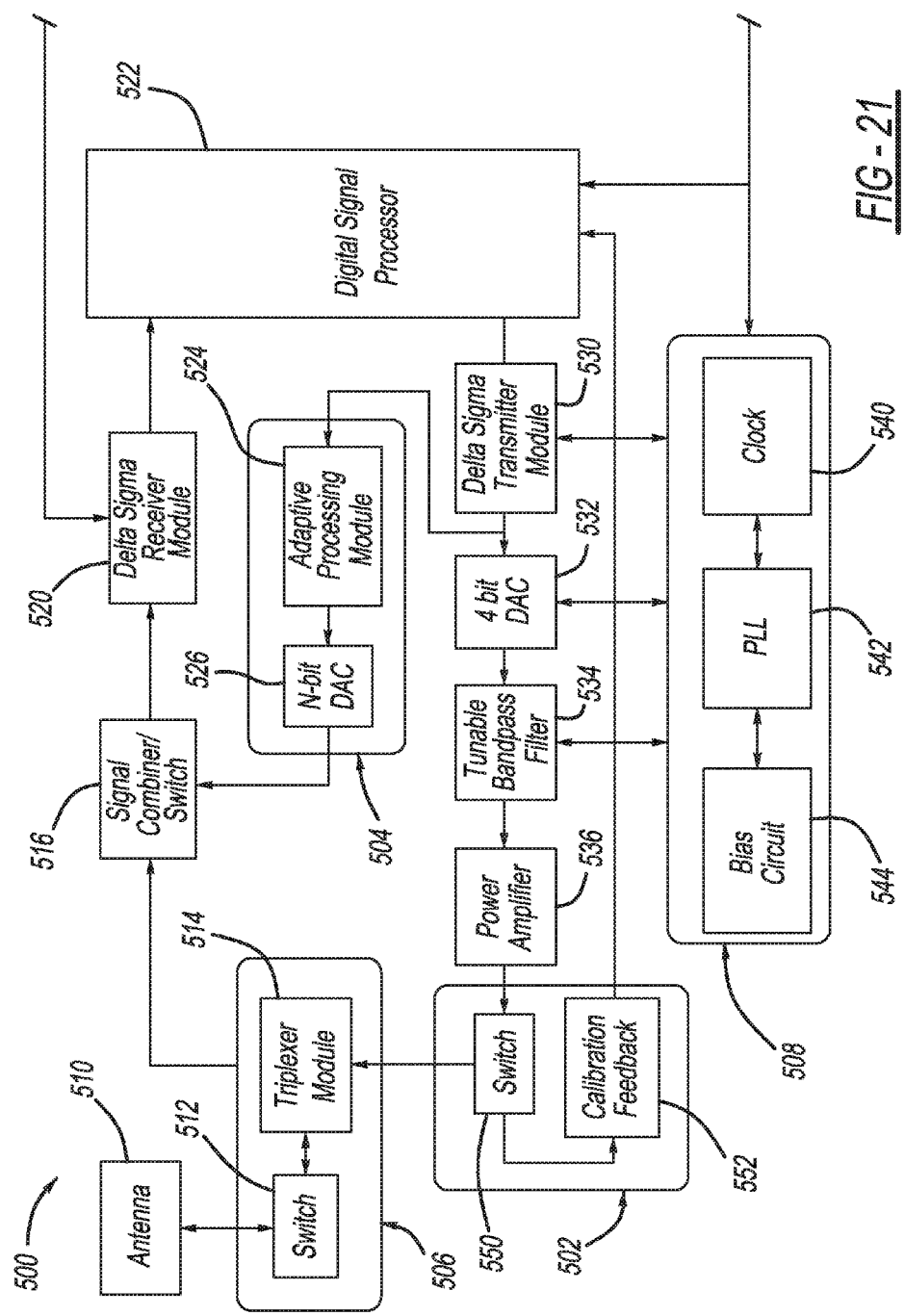
FIG. 21 is a schematic block diagram of a transceiver circuit including multiple calibration and correction modules.

FIG. 21 is a schematic block diagram of a transceiver circuit 500 similar to the architecture 68 discussed above that provides further detail concerning calibration and correction schemes for analog and mixed signal components in a delta-sigma data conversion process. An antenna 510 receives an analog signal and sends it to an integrated switch 512 in a switch module 506, and then to a triplexer module 514 to be directed to the proper frequency channel 50, where the module 514 also includes circulator and multiband combiner features. The analog signal then passes through a signal combiner/switch module 516 whose function is to remove any residual self-interference signals generated from the transmitter module, as described previously. Next, the signal is processed in a delta-sigma modulator receiver module 520 where it is sampled and converted to baseband digital bits that are passed to a baseband DSP 522 for further decoding. Note that there are no down conversion stages, mixers or filters in the receive path as found in typical receiver chains. Thus, the term "zero-IF" used for this transceiver architecture.

On the transmit side, the digital bits and symbols to be transmitted are generated in a baseband chip (not shown) and further processed by the DSP 522, and the digital signal is passed to a delta-sigma transmitter module 530 for direct conversion to an RF waveform at the desired carrier frequency and modulation. Note that as discussed above, a portion of the modulated signal is used in a self-interference cancellation module 504 that subtracts any residual transmit signal leaking into the receiver chain. More particularly, as discussed above with reference to the architecture 210, the self-interference cancellation module 504 includes an adaptive processing module 524 and an N-bit DAC 526. From the delta-sigma transmitter module 530, the transmit signal passes to a DAC 532 that converts the digital signal to an analog signal. From the DAC 532, the signal is bandpass filtered using a tunable bandpass filter 534, and then amplified in a power amplifier 536.

A calibration feedback and switch module 502 calibrates power amplifier distortions of the transmit signal in the manner discussed above for the module 400, after which the signal passes to the triplexer module 514 and the switch 512 for transmission by the antenna 510. The module 502 includes a switch 550, representing the switch 414, that either directs the transmit signal to the triplexer module 514 or to a calibration feedback circuit 552, representing the feedback device 412. In normal operation, the switch 550 sends the transmit signal to the antenna 510, however, for a high power calibration mode, the switch 550 is set to not radiate any RF energy through the antenna 510 and instead the receive path is used to calibrate the waveform parameters.

A compensation module 508 provides a high level representation of the timing, phase, frequency and bias setting components that will be used to calibrate and compensate various modules including the receiver module 520, the delta-sigma transmitter module 530, the bandpass filter 534 and other feedback and clock operations that are controlled in conjunction with DSP operations. The module 508 includes a surface acoustic wave (SAW) resonator, or equivalent, clock source 540 having low phase noise and jitter. Precision phase and frequency detectors will then be used as part of a low noise phase locked loop (PLL) comparator 542 to compensate for the frequency errors for the delta-sigma transmitter modulator 530 and the delta-sigma receiver modulator 520. A bias circuit 544 extracts the compensatory bias settings via feedback measurements as discussed below, and is computed in algorithms running on the baseband DSP 522. One such compensation is the power amplifier distortion, accomplished by setting switch 550 in the calibration module 502 to activate a feedback loop to enable calculating predistortion values in the calibration circuit 552 to compensate for the power amplifier distortion as discussed previously.

A related calibration is the high power behavior of the transmitter and the interaction with the triplexer module 514. The module 506 will integrate the linear switch 512 and the triplexer module 514 to characterize the high power path by using the calibrated receiver path to compare against a known tone. In this calibration mode, the transmit signal follows a different path, where it passes through the module 506 and into the receiver chain. In this configuration, which is discussed in detail below, the signal to the combiner/switch module 516 does not come directly from the triplexer module 514, but rather takes a different route in the module 506.

Figure 22:
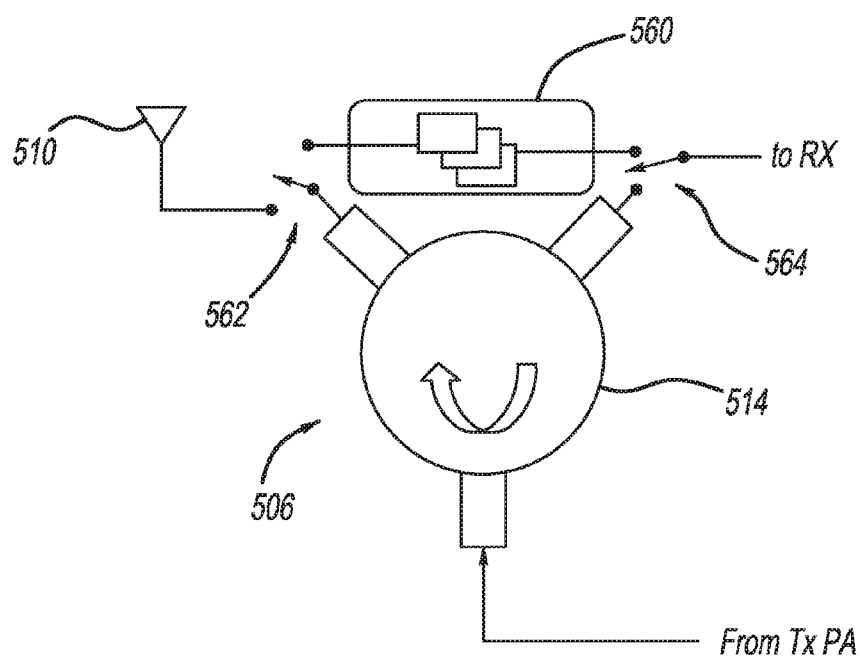
FIG. 22 is a schematic diagram of one embodiment of a triplexer module in the transceiver circuit shown in FIG. 21.

FIG. 22 is a more detailed schematic diagram of the module 506 showing triplexer and switch functionality. In this embodiment, the triplexer module 514 includes a first switch 562 that switches the signal path from the power amplifier 536 either to the antenna 510, or to a variable load/attenuator module 560 that reduces the power level of the signal, where the module 560 is capable of handling the full output power of the power amplifier 536 (e.g. +23~+25 dBm for a typical LTE waveform). A second switch 564 enables this attenuated signal, which is attenuated enough to be safe for the receiver to handle, to be passed directly to the receiver path. In normal operation, the switch 564 would connect to the triplexer module 514 so that the signals received at the antenna 510 would be passed onto the delta-sigma receiver module 520. The variable load/attenuator module 560 can be integrated in the module 506, external to the module 514, part of the module 514, or some combination thereof, depending on system efficiency, power handling and other design and packaging considerations.

The operation of this calibration procedure is as follows. To keep radiated power within FCC or other regulatory limits and to avoid interfering with other devices, and to calibrate for the effect of various mismatched conditions that may be present for the antenna 510, the variable load and attenuation module 560 will be incorporated as a programmable/software settable module that will be used to perform the calibration. In normal operation, the switch 562 will route the transmit signals from the power amplifier 536 through the triplexer module 514 directly to the antenna 510. However, for calibrating the transmit signals in higher power settings and to account for various mismatched load settings, the switch 562 will instead be set to bypass the antenna 510 to pass the transmit signal through the variable load/attenuator module 560, thus accurately replicating the mismatch conditions, and then directly to the receiver to complete the feedback path for doing high precision calibration and compensation. In the case of calibration, the switch 564 will connect the variable load/attenuator module 560 to the receiver section to complete the feedback path, whereas in normal operation the switch 564 simply connects the antenna 510 to the receiver section via the triplexer module 514. This arrangement allows for an accurate high power calibration method instead of having to look to the transmitter to receive leakage signal to use as a calibration path, since that signal itself may have frequency dependent variations.

Note that one complication that may arise is how to calibrate the receiver path independently without the effects of the transmit path being superimposed on the measurements. An innovative solution to this problem is to utilize the self-interference cancellation module 504 also as a calibration pathway. Since the module 504 is directly tapped off of the digital lines without going through the transmit chain, digital pre-distortion and calibration algorithms in the DSP 522 can be used to iteratively tune the receiver components (in conjunction with tones and stable reference clock signal from the module 508) to compensate for any calibration offsets.

The variable load/attenuator module 560 may include multiple sub-modules, each with a different level of attenuation, and each with its own signal path. The different attenuation levels in the sub-modules would be designed to accommodate different power levels of the transmit signal during calibration. For clarity, FIG. 22 shows only a single signal path through the variable load/attenuator module 560, and the switches 562 and 564 are accordingly shown as single pole double throw devices. It is to be understood that the variable load/attenuator module 560 may have multiple inputs and outputs. For example, the variable load/attenuator module 560 could be designed with three inputs and three outputs (three different signal paths through unique attenuation sub-modules), and in this case the switches 562 and 564 would be single pole quadruple throw devices.

In addition to the calibration techniques described above, the present invention discloses a novel method to calibrate the receiver performance and correct for deviations and degradations of the delta-sigma modulator due to device mismatch or process variations without injecting calibration signals or tones. Furthermore, this calibration technique does not require alteration to the signal path which current state of the art calibration methods require.

The calibration method disclosed herein can reduce the implementation area of the radio-frequency (RF) and analog circuits in a delta-sigma modulator and eliminate the potential signal loss on the feedback path because the transceiver neither needs a dedicated calibration tone generator nor has to break the feedback path when performing the calibration for the delta-sigma modulator. This calibration method provides a robust and scalable calibration mechanism for delta-sigma modulators and delta-sigma modulator based radio receivers. While the embodiment discussed below is for a cellular transceiver, the method can be applied to any delta-sigma based receiver.

Some transceivers known in the art employ a calibration-tone injection methodology for receiver calibration. A major disadvantage of calibration-tone systems is that they require extra resources, such as computational resources and power consumption, on the circuit to generate the tone. Other known systems utilize an additional switch in the feedback loop. The disadvantage of switched feedback loop systems, in addition to requiring the additional switch, is that the additional switch causes signal loss and degradation on the feedback path.

Figure 23:
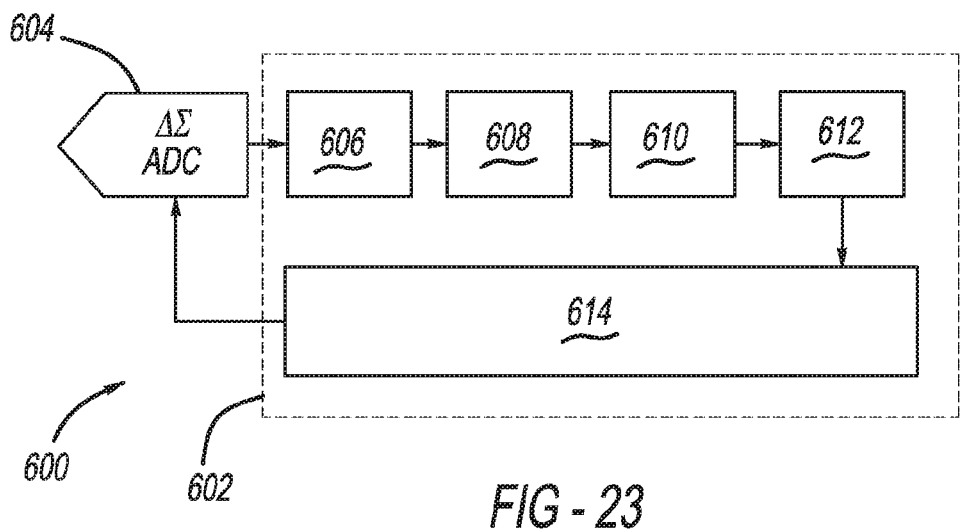
FIG. 23 is a block diagram of a receiver module that includes a digital signal processor that calibrates a delta-sigma modulator without using testing-tone injection.

FIG. 23 is a block diagram of a receiver module 600 for a front-end of a transceiver of the type being discussed herein that provides receive signal calibration as discussed above without the requirement of calibration tone injection. The module 600 includes a delta-sigma modulator 604, such as the delta-sigma modulator 52, and a DSP 602, such as the DSP 54. As discussed above, the delta-sigma modulator 604 converts an analog signal to a digital signal to be processed by the DSP 602. The DSP 602 includes a Fast-Fourier transformer (FFT) 606 that receives the digital signal from the modulator 604 and converts it to the frequency domain. The frequency signal from the FFT 606 is sent to a moving average (MAV) circuit 608 and then to a differentiator circuit 610 whose operations are discussed below. The differentiated frequency signal is then sent to a minimum finder circuit 612 and a least-minimum-square (LMS)/gradient decent adaptive control circuit 614 that all combine to provide the calibration of the receive signal that is then sent back to the modulator 604 as will also be discussed in detail below.

Figure 24:
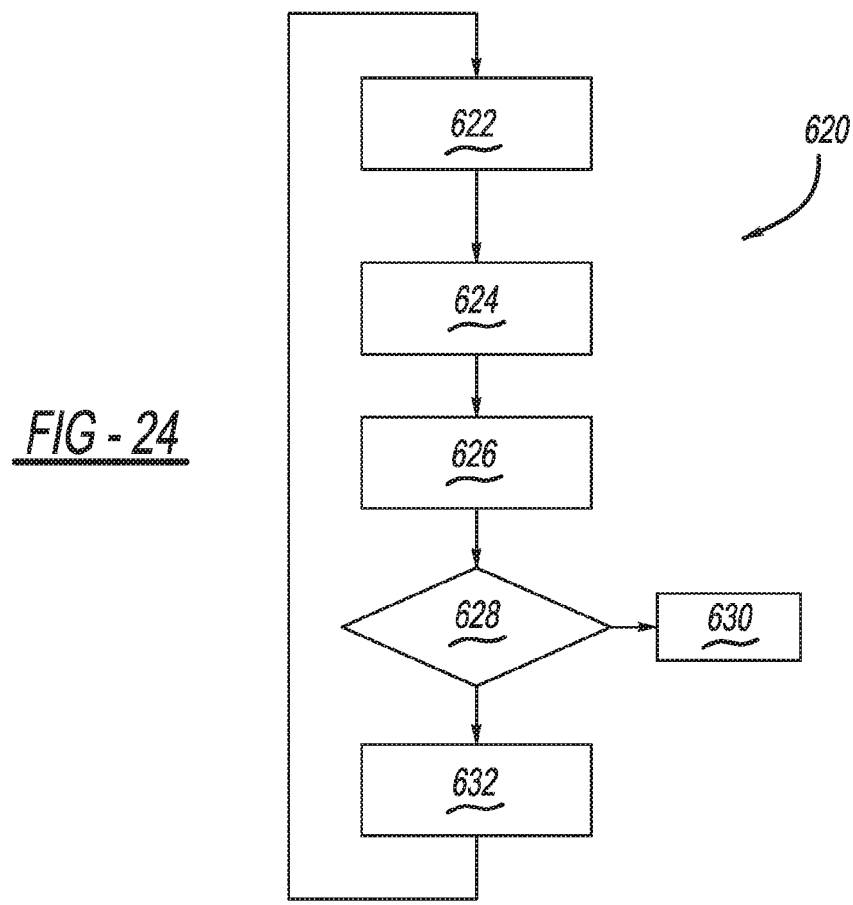
FIG. 24 is a flowchart diagram showing a calibration method used in the digital signal processor shown in FIG. 23.
Figure 25:
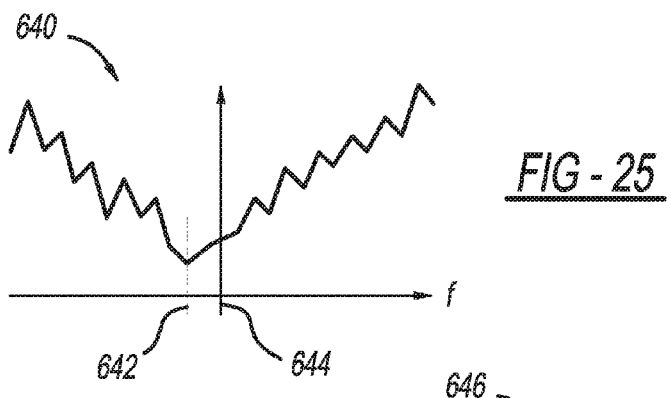
FIGS. 25-28 are graphs illustrating characteristic shapes of output signals in the receiver module shown in FIG. 23.
Figure 26:
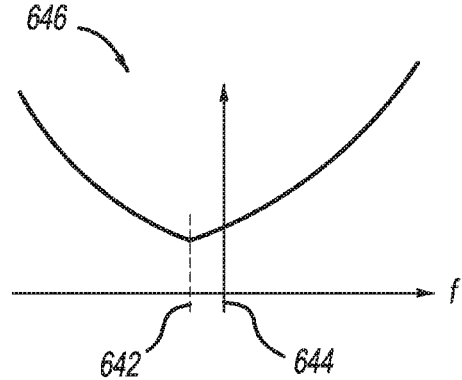

FIG. 24 is a flow chart diagram 620 showing the operation of the receiver module 600, and FIGS. 25-28 are graph diagrams showing characteristic shapes of various signals. At box 622, the FFT 606 constructs a frequency spectrum of the digital signal using a known Fast-Fourier transform technique. The characteristic shape of the output signal of the FFT 606 is shown by graph 640 in FIG. 25, where the sawtooth-shaped curve is defined by signal amplitude on the vertical axis plotted against frequency on the horizontal axis. A frequency value 642 indicates an approximate center of the "notch" in the frequency response plot, and a frequency value 644 indicates a desired notch center frequency.

At box 624, the MAV circuit 608 smoothes the frequency spectrum of the frequency signal from the FFT 606 by applying a moving average to the signal. The characteristic shape of the output signal of the MAV circuit 608 is shown by graph 646 in FIG. 26, where the sawtooth-shaped frequency response curve has been smoothed to a much simpler shape with a better-defined notch minimum.

Figure 27:
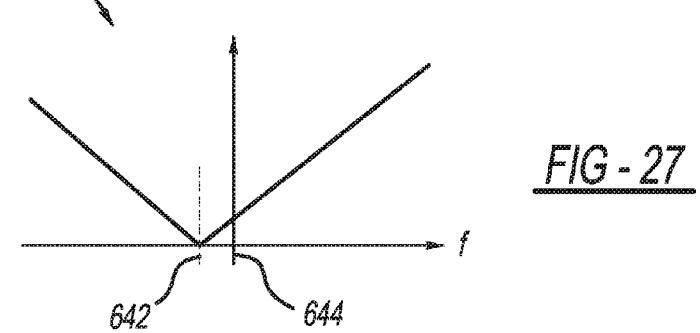

At box 626, the differentiator circuit 610 differentiates the moving average frequency response curve, where the output signal of the circuit 610 is shown by graph 648 in FIG. 27, and where the vertical axis now represents the slope of the frequency response differential.

Figure 28:
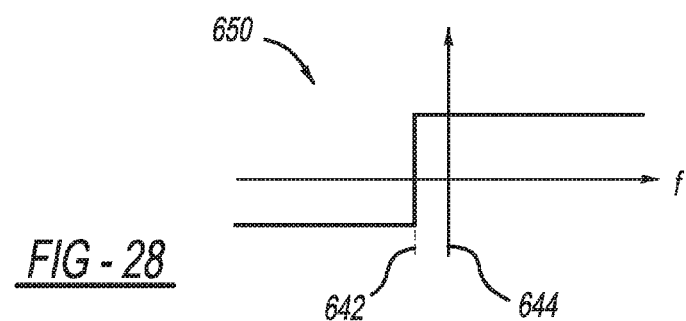

At decision diamond 628, the minimum finder circuit 612 converts the signal from the circuit 610 into a simple positive 1 or negative 1 value shown by graph 650 in FIG. 28, where the vertical axis now represents the sign of the previously-calculated slope value, where all slopes above the frequency value 642 have a positive sign and all slopes below the frequency value 642 have a negative sign. At the decision diamond 628, the location of the frequency value 642 (actual notch center) with respect to the frequency value 644 (desired notch center) is checked to determine if the frequency difference meets system specifications. In other words, the process compares the transition between the negative value and the positive value determined by the actual notch frequency value 642 to the desired frequency value 644, and determines whether the difference is greater than a predetermined threshold value. If not, then the modulator 604 does not need calibration, and the process ends at box 630. If the frequency difference does not meet specifications, i.e., the difference is greater than the threshold then the control circuit 614 provides calibration signals to the modulator 604. Calibration continues to ensure the ADC 604 remains within specification.

In summary, the digital signal processing techniques of the DSP 602 analyze the notch characteristics of the ADC frequency response, and adjust the circuit parameters of the ADC 604 as needed to produce a notch at the desired frequency. This calibration is performed using existing receiver hardware, and without testing tone injection, providing the benefits discussed above. After calibration, the receiver will have a maximum signal noise ratio (SNR) at the desired frequency due to the notch produced during this calibration process.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A transceiver front-end circuit for a cellular radio, said transceiver circuit comprising:
   an antenna operable to transmit signals and receive signals;
   a switch module including a switching network that directs analog transmit signals to be transmitted to the antenna and receives receive signals from the antenna, said switch module further including a multiplexer module coupled to the switching network and including a plurality of signal paths, where each signal path includes a bandpass filter that passes a different frequency band than the other bandpass filters and a circulator that provides signal isolation between the transmit signals and the receive signals;
a receiver module including a separate signal channel for each of the signal paths in the multiplexer module, where each signal channel in the receiver module includes a receiver delta-sigma modulator that converts analog receive signals to representative digital signals;
a transmitter module including a transmitter delta-sigma modulator for converting digital signals to the transmit signals, said transmitter module including a tunable bandpass filter and a power amplifier for amplifying the transmit signals before transmitting; and
a calibration feedback and switch module receiving the amplified transmit signals from the power amplifier, said calibration and switch module including a first switch that selectively directs the amplified transmit signals to the antenna or a calibration circuit that determines predistortion values in the transmit signals that are fed back as a calibration feedback signal to the transmitter module to compensate for distortions in the power amplifier.

2. The transceiver circuit according to claim 1 wherein the switching network directs the transmit signals from the power amplifier to the receiver module to provide transmit signal calibration.

3. The transceiver circuit according to claim 2 wherein the switch module includes a variable low/attenuator module for attenuating the transmit signals before being sent to the receiver module.

4. The transceiver circuit according to claim 3 wherein the switching network includes a second switch that selectively directs the transmit signals to the antenna or the variable low/attenuator module and a third switch that selectively directs the attenuated transmit signals from the variable low/attenuator module to the receiver module or the transmit signals from the multiplexer module to the receiver module.

5. The transceiver circuit according to claim 1 further comprising a compensation module that provides timing, phase, frequency and bias setting signals to the receiver module and the transmitter module.

6. The transceiver circuit according to claim 5 wherein the compensation module includes a surface acoustic wave (SAW) resonator clock source having low phase noise and jitter.

7. The transceiver circuit according to claim 5 wherein the compensation module includes a low noise phase locked loop (PLL) comparator that compensates for frequency errors in the receiver delta-sigma modulator and the transmitter delta-sigma modulator.

8. The transceiver circuit according to claim 5 wherein the compensation module includes a bias circuit for providing bias settings for the calibration feedback signal.

9. The transceiver circuit according to claim 1 further comprising a self-interference cancellation module that removes residual transmit signals that leak into the receiver module.

10. The transceiver circuit according to claim 9 wherein the receiver module includes a signal combiner and switch module that receives a cancellation signal from the cancellation module and operates to remove the residual signals generated by the transmitter module.

11. The transceiver circuit according to claim 1 wherein the multiplexer module is a triplexer module.

12. The transceiver circuit according to claim 1 wherein the cellular radio is a vehicle cellular radio.

13. A transceiver front-end circuit for a cellular radio, said transceiver circuit comprising:

an antenna operable to transmit signals and receive signals;
a switch module including a switching network that directs analog transmit signals to be transmitted to the antenna and receives receive signals from the antenna, said switch module further including a multiplexer module coupled to the switching network and including a plurality of signal paths, where each signal path includes a bandpass filter that passes a different frequency band than the other bandpass filters and a circulator that provides signal isolation between the transmit signals and the receive signals;
a receiver module including a separate signal channel for each of the signal paths in the multiplexer module, each signal channel in the receiver module including a receiver delta-sigma modulator that converts analog receive signals to representative digital signals;
a transmitter module including a transmitter delta-sigma modulator for converting digital signals to the transmit signals, said transmitter module including a tunable bandpass filter and a power amplifier for amplifying the transmit signals before transmitting; and
a compensation module that provides timing, phase, frequency and bias setting signals to the receiver module and the transmitter module.

14. The transceiver circuit according to claim 13 wherein the compensation module includes a surface acoustic wave (SAW) resonator clock source having low phase noise and jitter.

15. The transceiver circuit according to claim 13 wherein the compensation module includes a low noise phase locked loop (PLL) comparator that compensates for frequency errors in the receiver delta-sigma modulator and the transmitter delta-sigma transmitter modulator.

16. The transceiver circuit according to claim 13 wherein the compensation module includes a bias circuit for providing bias settings for the calibration feedback signal.

17. A transceiver front-end circuit for a cellular radio, said transceiver circuit comprising:

an antenna operable to transmit signals and receive signals;
a switch module including a switching network that directs analog transmit signals to be transmitted to the antenna and receives receive signals from the antenna, said switch module further including a multiplexer module coupled to the switching network and including a plurality of signal paths, where each signal path includes a bandpass filter that passes a different frequency band than the other bandpass filters and a circulator that provides signal isolation between the transmit signals and the receive signals;
a receiver module including a separate signal channel for each of the signal paths in the multiplexer module, each signal channel in the receiver module including a receiver delta-sigma modulator that converts analog receive signals to representative digital signals; and
a transmitter module including a transmitter delta-sigma modulator for converting digital signals to the transmit signals, said transmitter module including a tunable bandpass filter and a power amplifier for amplifying the transmit signals before transmitting, wherein the switching network directs the transmit signals from the power amplifier to the receiver module to provide transmit signal calibration, said switch module further including a variable low/attenuator module for attenuating the transmit signals before being sent to the receiver module, wherein the switching network includes a second switch that selectively directs the transmit signals to the antenna or the variable low/attenuator module and a third switch that selectively directs the attenuated transmit signals from the variable low/attenuator module to the receiver module or the transmit signals from the multiplexer module to the receiver module.

18. The transceiver circuit according to claim 17 further comprising a self-interference cancellation module that removes residual transmit signals that leak into the receiver module.

19. The transceiver circuit according to claim 18 wherein the receiver module includes a signal combiner and switch module that receives a cancellation signal from the cancellation module and operates to remove the residual signals generated by the transmitter module.

* * * * *